United States Patent
Lee et al.

(10) Patent No.: US 9,536,913 B2
(45) Date of Patent: Jan. 3, 2017

(54) DISPLAY DEVICE INTEGRATED WITH TOUCH SCREEN PANEL AND METHOD FOR FABRICATING THE SAME

(71) Applicant: LG DISPLAY CO., LTD., Seoul (KR)

(72) Inventors: Jinbok Lee, Goyang-si (KR); MinJoo Kim, Seoul (KR); JungSun Beak, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 104 days.

(21) Appl. No.: 14/660,525

(22) Filed: Mar. 17, 2015

(65) Prior Publication Data
US 2015/0372028 A1 Dec. 24, 2015

Related U.S. Application Data

(62) Division of application No. 14/540,528, filed on Nov. 13, 2014, now Pat. No. 9,046,955.

(30) Foreign Application Priority Data

Jun. 24, 2014 (KR) ........................ 10-2014-0077034

(51) Int. Cl.
*H01L 27/12* (2006.01)
*G02F 1/1333* (2006.01)
(Continued)

(52) U.S. Cl.
CPC ....... *H01L 27/1288* (2013.01); *G02F 1/13338* (2013.01); *G06F 3/044* (2013.01);
(Continued)

(58) Field of Classification Search
None
See application file for complete search history.

(56) References Cited

U.S. PATENT DOCUMENTS 9,046,955 B1* 6/2015 Lee ........................ G06F 3/0412
2012/0038585 A1* 2/2012 Kim ........................ G06F 3/0412
345/174
(Continued)

FOREIGN PATENT DOCUMENTS

CN 103364983 A 10/2013
CN 103454819 A 12/2013
(Continued)

OTHER PUBLICATIONS

DeCanne, B. "Challenges of Display Integrated with Touch", EDN Asia Dec. 2012 pp. 1-4 downloaded from URL<http://www.eetasia.com/STATIC/PDF/201212/EEOL_2012DEC04_SENS_CTRL_TA_01.pdf?SOURCES=DOWNLOAD> on Aug. 23, 2016.*

*Primary Examiner* — Joseph Schoenholtz
(74) *Attorney, Agent, or Firm* — Dentons US LLP

(57) ABSTRACT

Disclosed is a display device integrated with a touch screen panel and a method for fabricating the same. The display includes: a TFT positioned at each pixel region; a first electrode spaced from one of a source electrode or a drain electrode of the TFT; a second electrode facing the first electrode; a TFT protective layer positioned on the TFT and has a first contact hole; a touch signal line positioned between a first touch connection pattern, which is made of the same material as the first electrode, and a second touch connection pattern made of the same material as the second electrode, and transfers a touch driving signal to the second touch connection pattern; a first connection pattern made of the same material as the second electrode; and a first electrode protective layer positioned on the first electrode and the touch signal line.

6 Claims, 42 Drawing Sheets

(51) Int. Cl.
  *G06F 3/044*     (2006.01)
  *G06F 3/041*     (2006.01)
  *G02F 1/1362*    (2006.01)
  *G02F 1/1345*    (2006.01)
  *G02F 1/1343*    (2006.01)

(52) U.S. Cl.
  CPC ........ *G06F 3/0412* (2013.01); *H01L 27/1255* (2013.01); *G02F 1/13458* (2013.01); *G02F 1/136227* (2013.01); *G02F 2001/134372* (2013.01); *G02F 2001/136236* (2013.01); *G06F 2203/04103* (2013.01); *H01L 27/124* (2013.01)

(56) References Cited

U.S. PATENT DOCUMENTS

| | | |
|---|---|---|
| 2013/0162570 A1 | 6/2013 | Shin et al. |
| 2013/0249820 A1 | 9/2013 | Woo et al. |
| 2013/0257794 A1 | 10/2013 | Lee et al. |
| 2013/0320346 A1 | 12/2013 | Woo et al. |
| 2014/0132534 A1* | 5/2014 | Kim ................ G06F 3/0412 345/173 |
| 2014/0168538 A1* | 6/2014 | Kim ................ G06F 3/044 349/12 |

FOREIGN PATENT DOCUMENTS

| | | |
|---|---|---|
| KR | 10-2013-0072591 A | 7/2013 |
| KR | 10-2013-00110392 A | 10/2013 |

\* cited by examiner

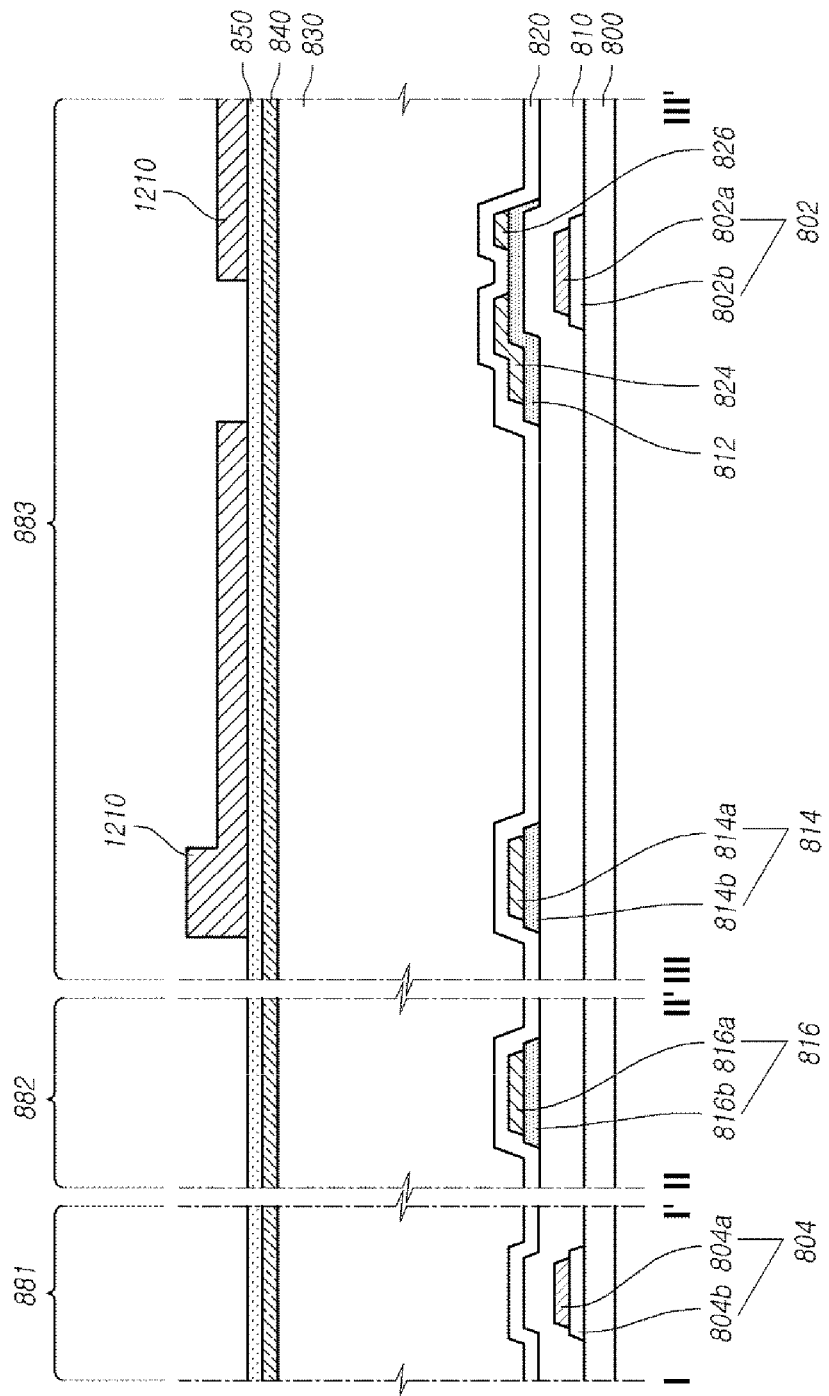

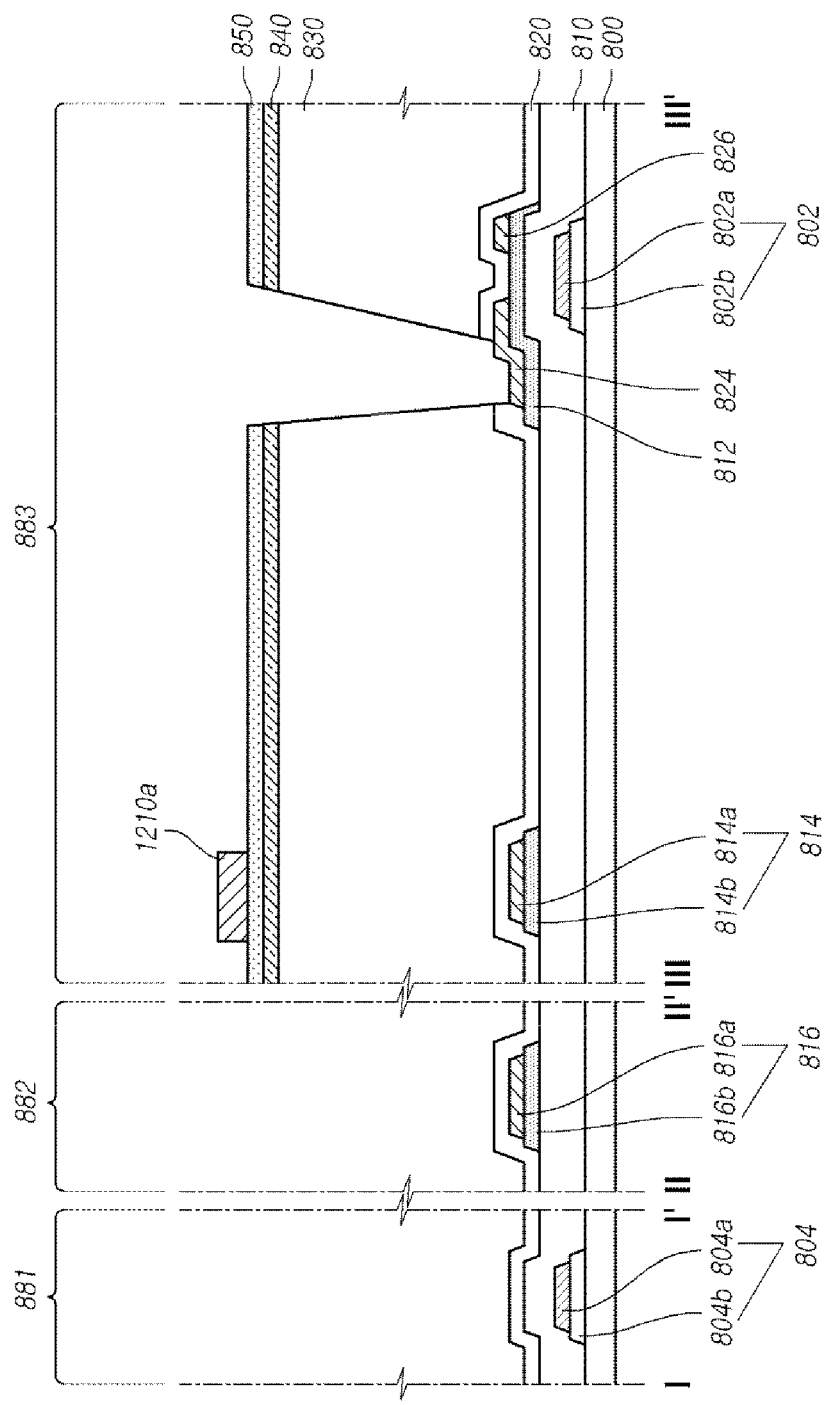

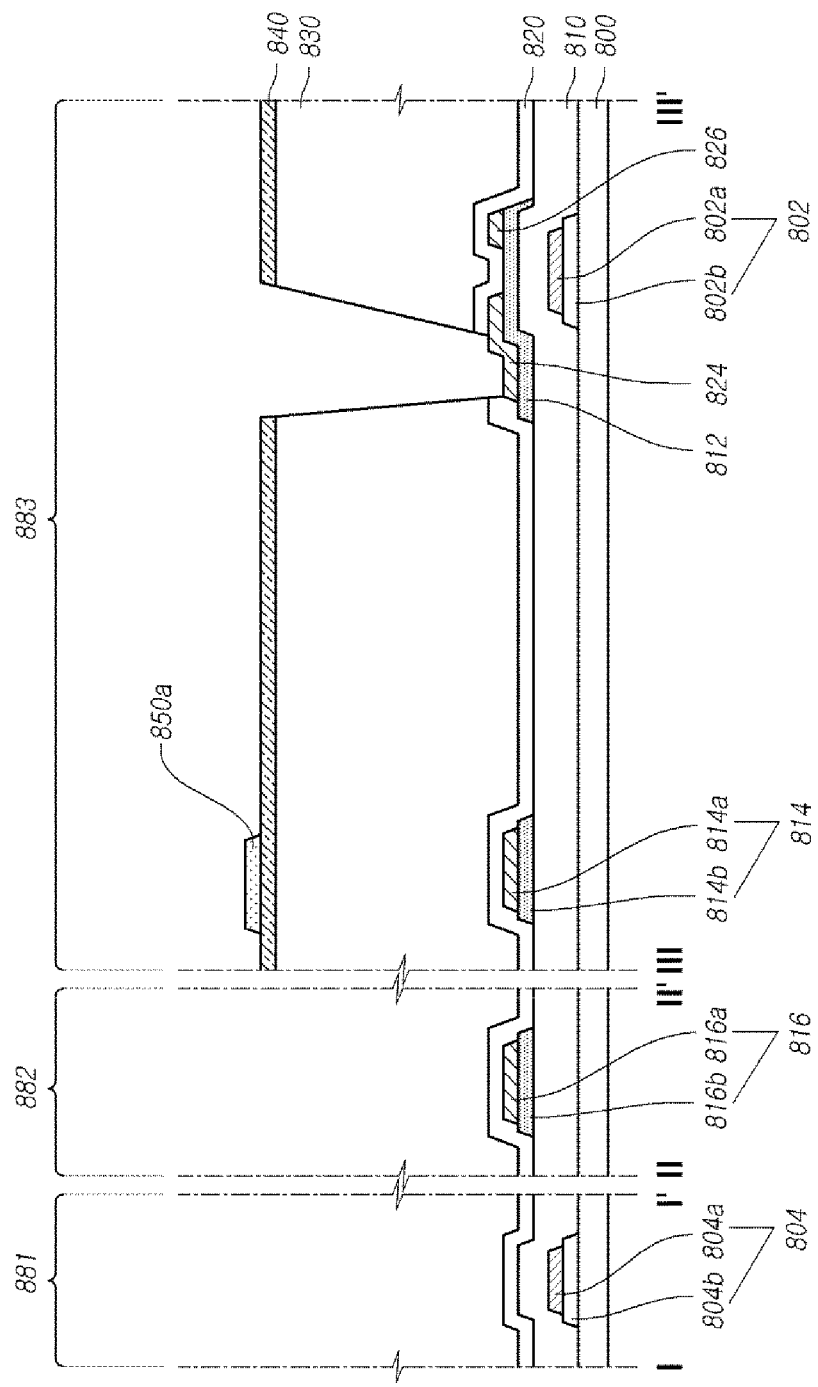

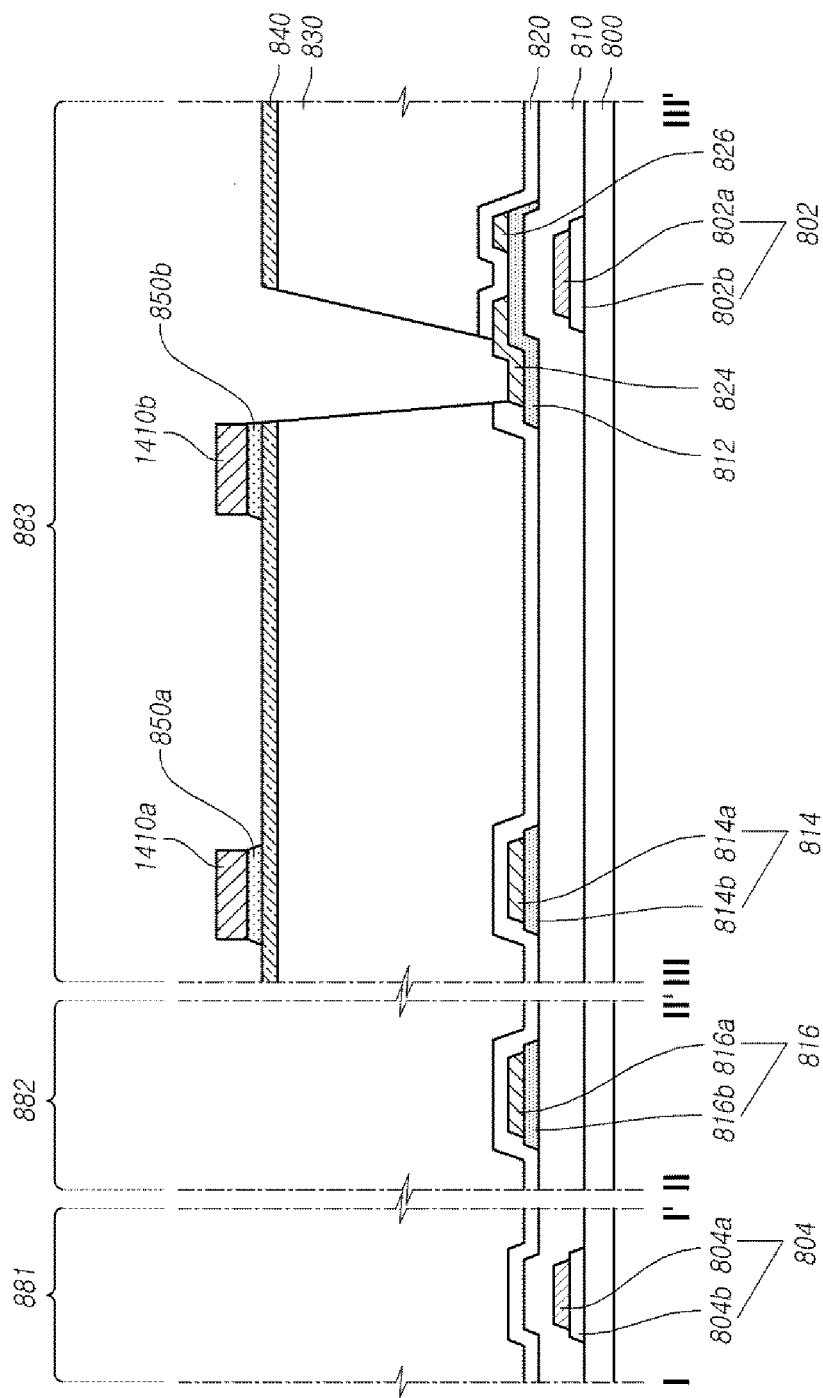

DISPLAY DEVICE INTEGRATED WITH TOUCH SCREEN PANEL AND METHOD FOR FABRICATING THE SAME

CROSS-REFERENCE TO RELATED APPLICATION

This application is a divisional application of U.S. patent application Ser. No. 14/540,528 filed Nov. 13, 2014, which claims priority from and the benefit under 35 U.S.C. §119(a) of Korean Patent Application No. 10-2014-0077034, filed on Jun. 24, 2014, both of which are hereby incorporated by reference for all purposes as if fully set forth herein.

BACKGROUND OF THE INVENTION

Field of the Invention

The present invention relates to a display device integrated with a touch screen panel and a method for fabricating the same.

Description of the Prior Art

As an information-based society has continued to develop, the demand for display devices for displaying images in various forms is increasing. Recently, Liquid Crystal Displays (LCD), Plasma Display Panels (PDP) and Organic Light Emitting Diode (OLED) Display Devices are utilized for displaying the images.

Such display devices provide an input means based on touches that are different from the typical input means, such as buttons, keyboards and mouses, which enables a user to conveniently and intuitively input data or commands.

In order to provide such an input means based on touches, it is required to recognize a user's touch and accurately detect a touch coordinate.

In doing so, typically, a touch sensing technique adopting one of a resistive type, a capacitive type, an electromagnetic resonance type, an infrared type and acoustic wave type is provided.

In addition, a touch sensor that is built in the display device has been developed in applying a touch screen to the display device. Particularly, the display device of an in-cell type in which a common electrode formed on a lower substrate is utilized for a touch sensing electrode has been developed. However, since the display device of the in-cell type requires an additional process in order to form the touch sensing electrode, it takes a high cost and a long time to manufacture the product, which makes the product uncompetitive.

SUMMARY OF THE INVENTION

In this background, the present invention is to provide a display device integrated with a touch screen panel and a method for fabricating the same, by which the manufacturing process may be simplified.

In accordance with an aspect of the present invention, a display device may include: a gate line that is positioned in the first direction on the substrate to transfer a gate signal; a data line that is positioned in the second direction on the substrate to transfer a data signal; a thin film transistor that is positioned at each pixel defined by the intersection of the gate line and the data line; a first electrode that is spaced from one of a source electrode or a drain electrode of the thin film transistor; a second electrode that faces the first electrode; a thin film transistor protective layer that is positioned on the thin film transistor and has a first contact hole formed therein; a touch signal line that is positioned between a first touch connection pattern, which is made of the same material as that of the first electrode to be separated from the first electrode, and a second touch connection pattern, which is made of the same material as that of the second electrode to be connected with the second electrode, and transfers a touch driving signal to the second touch connection pattern; a first connection pattern that is made of the same material as that of the second electrode and connects the source electrode or the drain electrode with the first electrode through the first contact hole; and a first electrode protective layer that is positioned on the first electrode and the touch signal line.

In accordance with another aspect of the present invention, a display device may include: a display panel that includes; a thin film transistor that is positioned at each of N×P pixels defined by intersections of gate lines, which are positioned in the first direction on a substrate to transfer gate signals, and data lines, which are positioned in the second direction on the substrate to transfer data signals, N×P first electrodes that are spaced from one of source electrode or drain electrode of the thin film transistor, P second electrodes that face the first electrodes and provide the same signal to all of the N pixels, a thin film transistor protective layer that is positioned on the thin film transistor and has a first contact hole formed therein, a touch signal line that is positioned between a first touch connection pattern, which is made of the same material as that of the first electrode to be separated from the first electrode, and a second touch connection pattern, which is made of the same material as that of the second electrode to be connected with the second electrode, and transfers a touch driving signal to the second touch connection pattern, N×P first connection patterns that are made of the same material as that of the second electrode and connect one of the source electrode and the drain electrode with the first electrode through the first contact hole, and a first electrode protective layer that is positioned on the first electrode and the touch signal line; a touch integrated circuit that applies a touch driving signal to all or some of a plurality of the second electrodes when the display panel operates in a touch driving mode; a data driving unit that supplies a data voltage to a plurality of the data lines when the display panel operates in a display driving mode; and a gate driving unit that supplies scan signals to a plurality of the gate lines in sequence when the display panel operates in a display driving mode.

In accordance with another aspect of the present invention, a method for fabricating signal lines of a display device integrated with a touch screen panel may include: forming a thin film transistor on a substrate; accumulating a thin film transistor protective layer covering the thin film transistor, a first electrode layer and a conductive metal layer; etching the first electrode layer, the conductive metal layer and the thin film transistor protective layer by using a first photo-mask to form a first contact hole, through which a source electrode or a drain electrode is exposed, in the first electrode layer and the thin film transistor protective layer, and forming a first electrode and a touch signal line; coating a first electrode protective layer; coating photoresist by using a second photo-mask and forming a first electrode and a first touch connection pattern separated from the first electrode; and forming a second electrode and a second touch connection pattern made of the same material as that of the second electrode to be connected with the second electrode by using a third photo-mask, and at the same time, forming a first connection pattern, which connects one of the exposed source electrode or the drain electrode with the first electrode through the first contact hole.

According to the present invention, it may be provided a method for fabricating a display device integrated with a touch screen panel by which the manufacturing process can be simplified, and a display device fabricated by the method.

BRIEF DESCRIPTION OF THE DRAWINGS

The above and other objects, features and advantages of the present invention will be more apparent from the following detailed description taken in conjunction with the accompanying drawings, in which:

FIGS. 12A to 12F illustrate a process of forming the first electrode, a touch signal line and a thin film transistor protective layer according to the first embodiment of the present invention;

FIGS. 14A to 14F illustrate a process of forming the first electrode, a touch signal line, a thin film transistor protective layer according to the second embodiment of the present invention;

DETAILED DESCRIPTION OF THE EXEMPLARY EMBODIMENTS

Figure 1:
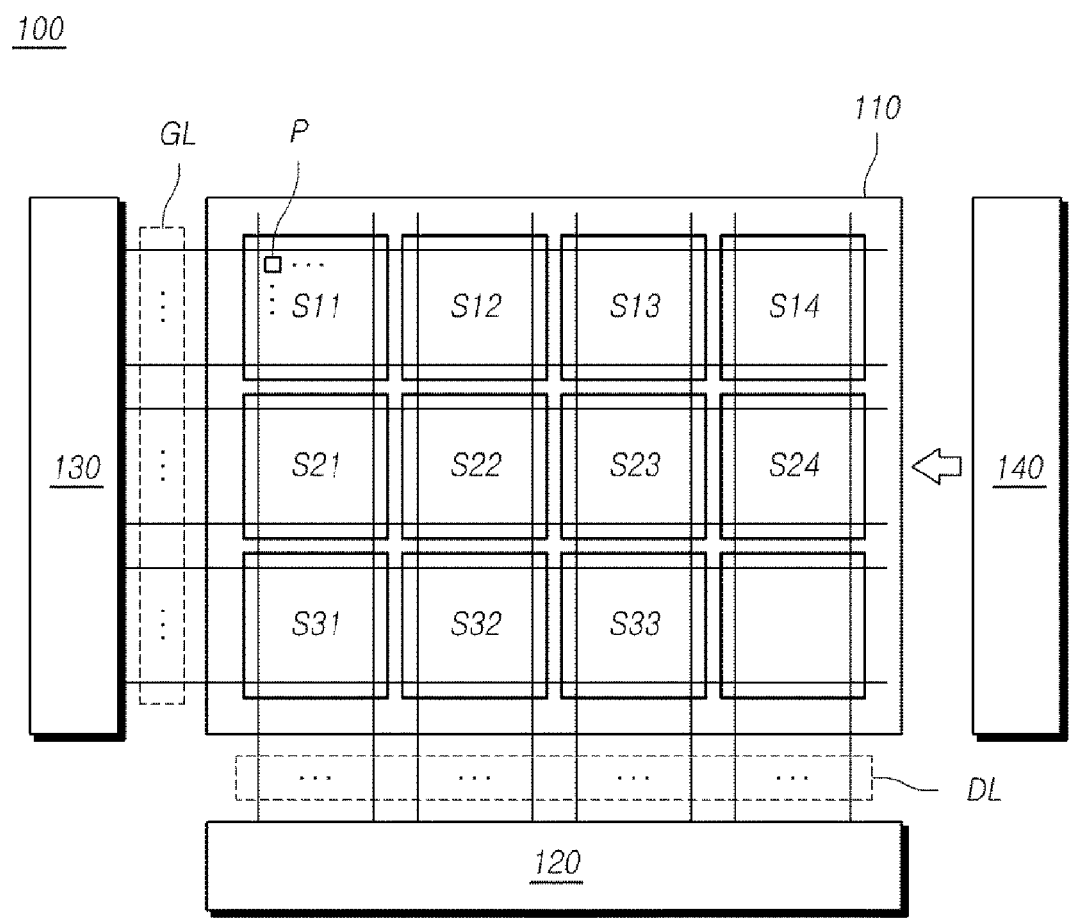
FIG. 1 schematically illustrates a display device integrated with a touch screen panel according to an embodiment of the present invention.

Hereinafter, embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

The present invention provides a processing method of using metal substances necessary for the formation of a common electrode and/or metal substances necessary for the formation of a touch signal line in order to connect a pixel electrode with a source electrode or a drain electrode, and a display device that includes a connection pattern by which a source electrode or a drain electrode is connected with a pixel electrode.

FIG. 1 schematically illustrates a display device integrated with a touch screen panel according to an embodiment of the present invention.

Referring to FIG. 1, the display device 100 integrated with a touch screen panel according to an embodiment of the present invention includes a panel 110, a data driving unit 120, a gate driving unit 130 and an integrated circuit 140 (hereinafter, referred to as a "touch integrated circuit") for controlling a touch signal, or the like.

On the panel 110, a plurality of gate lines GL are formed in the first direction (e.g., lateral direction or longitudinal direction), and a plurality of data lines DL are formed in the second direction (e.g., longitudinal direction or the lateral direction). Also, a plurality of pixels P are defined at each crossing of the data lines DL and the gate lines GL.

In a pixel area of each pixel P, a source electrode or a drain electrode is connected with the data line DL, and a gate electrode is connected with the gate line GL. Further, one of the drain electrode and the source electrode is connected with a pixel electrode (or the first electrode).

In addition, a plurality of electrodes S11 to S14, S21 to S24 and S31 to S34, which are grouped or blocked by a plurality of electrode groups, is formed to be spaced from each other on the panel 110.

The panel 110 plays the role of a "touch screen panel (TSP)" as well as a "display panel".

That is, the panel 110 may be a combined panel of the display panel and the touch screen panel, or may be a display panel of an in-cell type in which the touch screen panel (TSP) is built.

When the panel 110 plays the role of the display panel, the panel 110 is driven in a "display driving mode", and when the panel 110 plays the role of the touch screen panel, the panel 110 is driven in a "touch driving mode".

In the display driving mode of the panel 110, the data driving portion 120 supplies a data voltage Vdata or a data signal for a display to the plurality of data lines DL.

In the display driving mode of the panel 110, the gate driving portion 130 supplies a gate signal or a scan signal for a display to the plurality of gate lines GL in sequence.

The touch integrated circuit 140 applies touch driving signals to all or some of the plurality of electrodes S11 to S14, S21 to S24 and S31 to S34 directly connected through touch signal lines in the touch driving mode of the panel 110. Here, the touch driving signal may be referred to as a touch sensing signal, a touch sensing voltage or a touch driving voltage as well.

For example, in the touch driving mode of the panel 110, the touch integrated circuit 140 applies touch driving signals to all or some of a plurality of electrode groups which are grouped by the plurality of electrodes S11 to S14, S21 to S24 and S31 to S34.

Meanwhile, the display device 100 integrated with a touch screen panel, according to an embodiment of the present invention, may further include a timing controller (not shown) for controlling the driving timing of the data driving portion 120 and the gate driving portion 130.

In addition, the display device 100 integrated with a touch screen panel, according to an embodiment of the present invention, may further include a touch controller (not shown) that receives sensed data (e.g., capacitance, the change in capacitance, voltages, or the like) measured by the touch integrated circuit 140 through the plurality of electrodes S11 to S14, S21 to S24 and S31 to S34 that play the role of touch electrodes, and detects a touch and a coordinate thereof.

Meanwhile, the display device 100 integrated with a touch screen panel, according to an embodiment of the present invention, repeats operations of the display driving mode and the touch driving mode. Further, the timing of the display driving mode and the touch driving mode may be controlled by control signals output from the timing controller or the touch controller, or may be controlled by cooperation of the timing controller and the touch controller in some cases.

Meanwhile, the display device 100 integrated with a touch screen panel, according to an embodiment of the present invention, adopts a capacitance touch type by which the touches and coordinates are detected based on the change in capacitance through a plurality of touch electrodes (e.g., lateral electrodes and longitudinal electrodes) formed on the touch screen panel.

The capacitance touch type may be divided into a mutual capacitance touch type and a self-capacitance touch type.

In the mutual capacitance touch type, one of the capacitance touch types, one of the lateral electrodes and the longitudinal electrodes may be Tx electrodes (driving electrodes) which are applied with a driving voltage, and the other of the lateral electrodes and the longitudinal electrodes may be Rx electrodes (sensing electrodes) that sense the driving voltage to make a capacitor with the Tx electrodes. The mutual capacitance touch type detects the touches and the touch coordinates, based on the change in capacitance (mutual capacitance) between the Tx electrodes and the Rx electrodes according to the touches of pointers, such as fingers, pens, or the like.

In the self-capacitance touch type, another of the capacitance touch types, each touch electrode makes capacitance (self-capacitance) with the pointers, such as fingers, pens, or the like. Further, the self-capacitance touch type measures a capacitance value between the touch electrode and the pointer according to the touch of the pointer to thereby detect the touch and the touch coordinate. In the self-capacitance touch type, the driving voltage (touch driving signal) is applied and sensed through the touch electrode, differently from the mutual capacitance touch type. Accordingly, the Tx electrodes are not distinguished from the Rx electrodes in the self-capacitance touch type.

The display device 100 integrated with a touch screen panel according to an embodiment of the present invention may adopt one of the above-described capacitance touch types (i.e., mutual capacitance touch type and self-capacitance touch type). For the convenience of explanation, the embodiments adopting the self-capacitance touch type will be described in the present specification.

The data driving portion 120 may include at least one data driver integrated circuit (IC) (also, referred to as a "source driver integrated circuit"). The data driver integrated circuit may be mounted on a bonding pad of the panel 110 in the type of tape automated boding (TAB) or chip-on-glass (COG), or may be directly formed on the panel 110. In some cases, the data driver integrated circuit may be integratedly formed on the panel 110.

The gate driving portion 130 may be positioned at one side of the panel 110 as shown in FIG. 1, or at both sides thereof, according to the driving type.

In addition, the gate driving portion 130 may include at least one gate driver integrated circuit (IC). The gate driver integrated circuit may be mounted on a bonding pad of the panel 110 in the type of tape automated boding (TAB) or chip-on-glass (COG), or may be directly formed on the panel 110 in a gate-in-panel (GIP) type. In some cases, the gate driver integrated circuit may be integratedly formed on the panel 110.

The touch integrated circuit 140 is an element separated from the data driving portion 120 and the gate driving portion 130 as shown in FIG. 1. The touch integrated circuit 140 may be provided at the outside of the data driving portion 120 and the gate driving portion 130, or may be provided inside the separate driver IC (e.g., display driver IC) that may include at least one of the data driving portion 120 and the gate driving portion 130, according to the implementation. Alternatively, the touch integrated circuit 140 may be implemented as an internal element of the data driving portion 120 and the gate driving portion 130.

Accordingly, the operation by which the touch integrated circuit 140 applies the touch driving signal to all or some of the plurality of electrodes acting as touch electrodes in the touch driving mode may correspond to the operation by which the separate driver IC including the touch integrated circuit 140 applies the touch driving signal to all or some of the plurality of electrodes acting as touch electrodes, or may correspond to the operation by which the data driving portion 120 or the gate driving portion 130 including the touch integrated circuit 140 applies the touch driving signal to all or some of the plurality of electrodes acting as touch electrodes, according to design.

The touch integrated circuit 140 is not limited to the detailed implementation and designs thereof, but it may be any element itself or an internal or external element thereof as long as it has the same or similar function as or to that set forth in the present specification.

In addition, although FIG. 1 illustrates only one touch integrated circuit 140, two or more touch integrated circuits may be provided.

Meanwhile, additional signal lines, which are connected with each of the plurality of electrodes S11 to S14, S21 to S24 and S31 to S34, are required to allow the touch integrated circuit 140 to apply the touch driving signal to all or some of the plurality of electrodes S11 to S14, S21 to S24 and S31 to S34.

At least one signal line, which is connected with each of the plurality of electrodes S11 to S14, S21 to S24 and S31 to S34 to transfer the touch driving signal or a common voltage, may be formed on the panel 110 in the first direction (e.g., longitudinal direction) or in the second direction (e.g., lateral direction).

Two or more signal lines, which are connected with each of the plurality of electrodes S11 to S14, S21 to S24 and S31 to S34, may give an effect that the resistance may be reduced.

Meanwhile, the formation direction of at least one signal line, which is connected with each of the plurality of electrodes S11 to S14, S21 to S24 and S31 to S34, may vary according to whether the plurality of electrodes S11 to S14, S21 to S24 and S31 to S34 is grouped and sensed in the first direction (e.g., longitudinal direction) in which the data lines are formed, or whether the plurality of electrodes S11 to S14, S21 to S24 and S31 to S34 is grouped and sensed in the second direction (e.g., lateral direction) in which the gate lines are formed.

Figure 3:
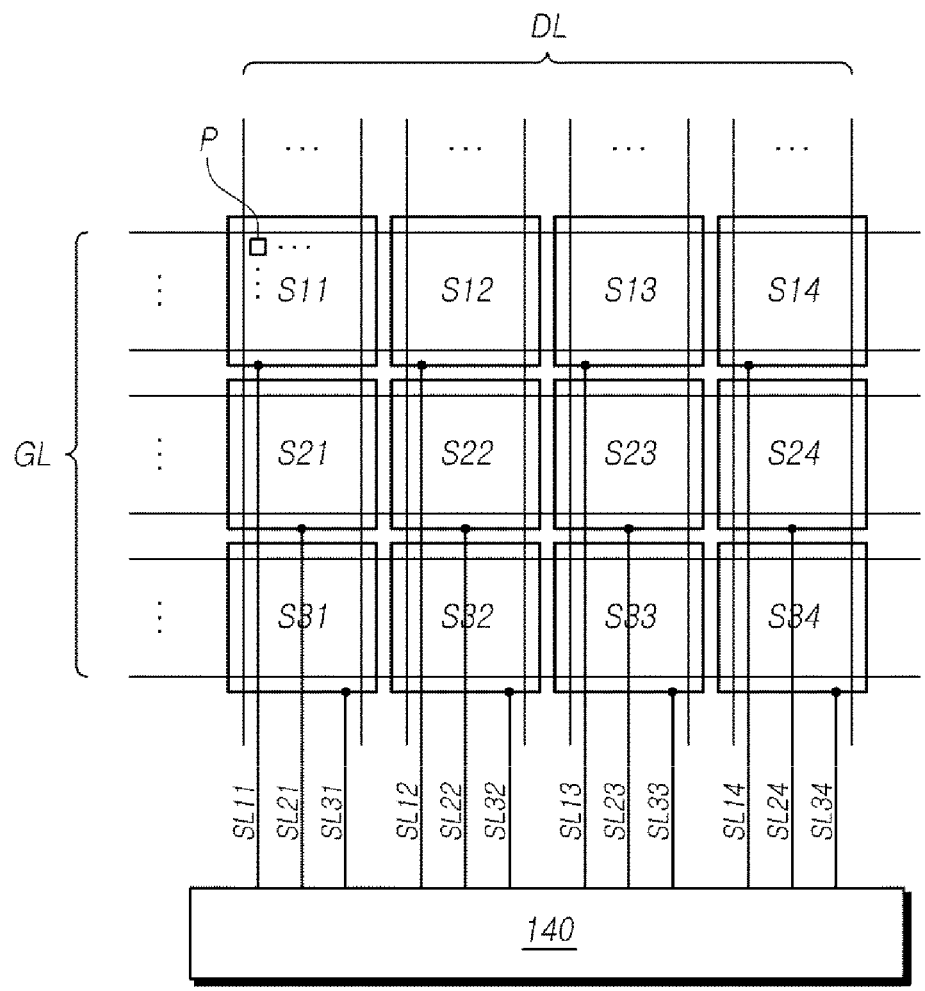
FIG. 3 is a plan view of a panel included in a display device integrated with a touch screen panel according to an embodiment of the present invention.

If the plurality of electrodes S11 to S14, S21 to S24 and S31 to S34 is grouped and sensed in the first direction (e.g., longitudinal direction) in which the data lines are formed, at least one signal line, which is connected with each of the plurality of electrodes S11 to S14, S21 to S24 and S31 to S34, may be formed in the first direction (e.g., longitudinal direction) in which the data lines are formed (see FIG. 3).

If the plurality of electrodes S11 to S14, S21 to S24 and S31 to S34 is grouped and sensed in the second direction (e.g., lateral direction) in which the gate lines are formed, at least one signal line, which is connected with each of the plurality of electrodes S11 to S14, S21 to S24 and S31 to S34, may be formed in the second direction (e.g., lateral direction) in which the gate lines are formed.

In the present specification, the plurality of electrodes S11 to S14, S21 to S24 and S31 to S34 acts as "touch electrode" to which the touch driving signals are applied all or in part in the touch driving mode, and acts as "common electrodes" that face the pixel electrodes on the panel to be thereby applied with a common voltage Vcom in the display driving mode, as set forth above. The electrode that acts as the touch electrode or the common electrode according to the driving mode is referred to as the second electrode.

The display device 100 integrated with a touch screen panel, according to an embodiment of the present invention, may be a liquid crystal display device of an in-plane-switching (IPS) type, in which liquid molecules horizontally positioned are rotated to display images so that high resolution, low power consumption and a wide viewing angle may be obtained. More specifically, the display device 100 may be the display device of an advanced high performance IPS (AH-IPS) type.

In this case, the pixel electrodes and the common electrodes S11 to S14, S21 to S24 and S31 to S34 may be formed on the same substrate in order to generate a horizontal electric field between the pixel electrodes and the common electrodes S11 to S14, S21 to S24 and S31 to S34 in the display driving mode.

The display device 100 integrated with a touch screen panel, according to another embodiment of the present invention, may be an organic light emitting display device in which an organic light-emitting layer is formed between the pixel electrode and the common electrode. At this time, the pixel electrode and the common electrode may be formed on the same substrate.

Figure 2:
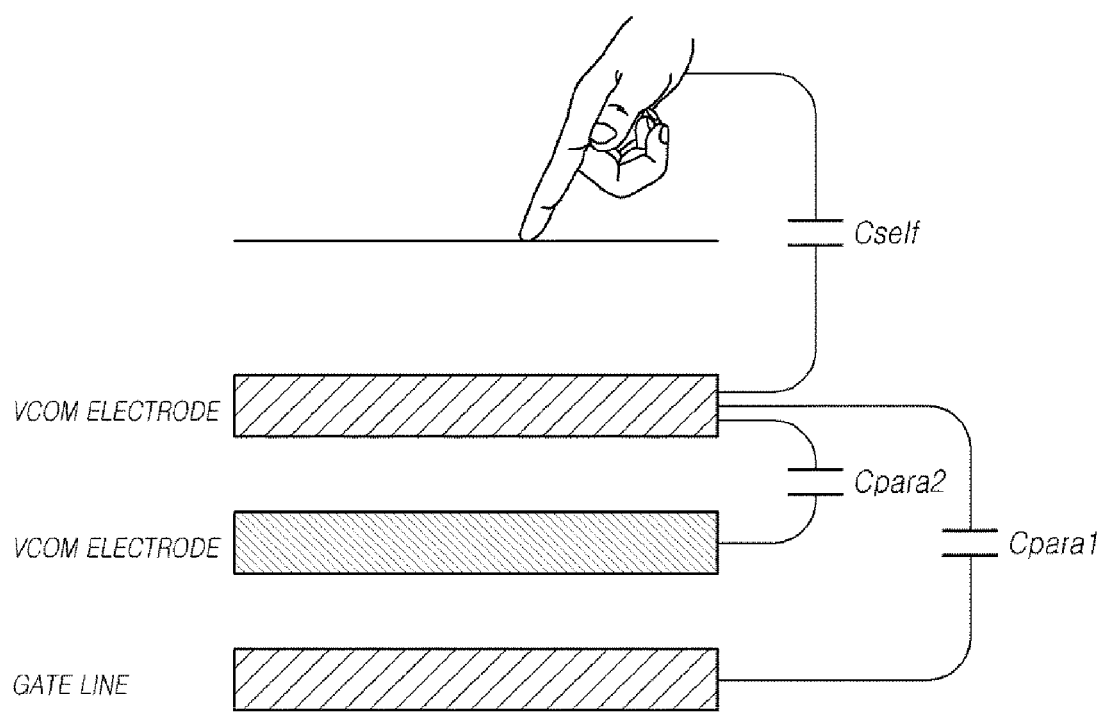
FIG. 2 illustrates capacitance components (Cself, Cpara1 and Cpara2) generated in a touch driving mode in a display device integrated with a touch screen panel according to an embodiment of the present invention.

FIG. 2 illustrates capacitance components (Cself, Cpara1 and Cpara2) generated in a touch driving mode in a display device integrated with a touch screen panel according to an embodiment of the present invention.

Referring to FIG. 2, the plurality of electrodes S11 to S14, S21 to S24 and S31 to S34, which acts as the touch electrodes in the touch driving mode and acts as the common electrodes that form a liquid capacitor with the pixel electrode in the display driving mode, creates self-capacitance Cself with pointers, such as fingers, pens, or the like in order to detect the touch and the touch coordinate in the touch driving mode. Meanwhile, the plurality of electrodes acting as the common electrodes may create parasitic capacitance Cpara1 and Cpara2 with the gate lines and the data lines, but the parasitic capacitance is too small to be considered.

Hereinafter, the panel 110 included in the display device 100 integrated with a touch screen panel according to an embodiment of the present invention, supply the common voltage and the touch driving signal to the plurality of electrodes S11 to S14, S21 to S24 and S31 to S34 acting as the common electrodes or the touch electrodes, supply the data voltage and the touch driving signal (or an equivalent signal) to the data lines DL, and supply data voltage and the touch driving signal (or an equivalent signal) to the gate lines GL will be described in detail.

The panel 110 of the display device 100 integrated with a touch screen panel according to an embodiment of the present invention may be described in detail with reference to FIGS. 3 to 5.

FIG. 3 is a plan view of a panel included in a display device integrated with a touch screen panel according to an embodiment of the present invention.

Referring to FIG. 3, the panel 110 is formed with a plurality of data lines DL, a plurality of gate lines GL and a plurality of electrodes S11 to S14, S21 to S24 and S31 to S34, as set forth above.

In addition, the panel 110 may operate in the display driving mode or in the touch driving mode, as described above.

In this regard, the plurality of data lines DL and the plurality of gate lines GL, which are formed on the panel 110, allow the panel 110 to operate as the display panel.

Further, the plurality of electrodes S11 to S14, S21 to S24 and S31 to S34 formed on the panel 110 allows the panel 110 to operate as both of the display panel and the touch screen panel.

More specifically, when the panel 110 operates as the display panel, i.e., when the panel 110 operates in the display driving mode, the plurality of electrodes S11 to S14, S21 to S24 and S31 to S34 is applied with the common voltage Vcom to be the "common electrodes" (or Vcom electrodes) that face the pixel electrodes (the first electrodes, not shown).

Further, when the panel 110 operates as the touch screen panel, i.e., when the panel 110 operates in the touch driving mode, the plurality of electrodes S11 to S14, S21 to S24 and S31 to S34 is applied with a touch driving voltage to be the "touch electrodes" that form a capacitor with the touch pointer (e.g., fingers, pens, or the like), so that the capacitance of the capacitor is measured.

That is, the plurality of electrodes S11 to S14, S21 to S24 and S31 to S34 acts as the common electrodes (Vcom electrodes) in the display driving mode and acts as the touch electrodes in the touch driving mode.

Further, the common voltage Vcom is applied to the plurality of electrodes S11 to S14, S21 to S24 and S31 to S34 in the display driving mode, and the touch driving signal is applied to the plurality of electrodes S11 to S14, S21 to S24 and S31 to S34 in the touch driving mode, respectively.

In doing so, as shown in FIG. 3, signal lines SL11 to SL14, SL21 to SL24 and SL31 to SL34 may be connected with the plurality of electrodes S11 to S14, S21 to S24 and S31 to S34 in order to transfer the common voltage or the touch driving signal to the plurality of electrodes S11 to S14, S21 to S24 and S31 to S34.

Accordingly, in the touch driving mode, the touch driving signal Vdt generated in the touch integrated circuit 140 may be transferred to all or some of the plurality of electrodes S11 to S14, S21 to S24 and S31 to S34 through the signal lines SL11 to SL14, SL21 to SL24 and SL31 to SL34. Also, in the display driving mode, the common voltage Vcom supplied from a common voltage supplier (not shown) may be applied to the plurality of electrodes S11 to S14, S21 to S24 and S31 to S34 through the signal lines SL11 to SL14, SL21 to SL24 and SL31 to SL34.

Referring to FIG. 3, a pixel P is defined at each crossing of the plurality of the data lines DL and the plurality of the gate lines GL, which are formed on the panel 110. Here, each pixel may be one of a red (R) pixel, a green (G) pixel and a blue (B) pixel.

Referring to FIG. 3, two or more pixels may be defined on the area (hereinafter, referred to as a unit touch electrode area) where each of the plurality of electrodes S11 to S14, S21 to S24 and S31 to S34 acting as the common electrodes and the touch electrodes is formed. That is, one of the plurality of electrodes S11 to S14, S21 to S24 and S31 to S34 may correspond to two or more pixels P.

For example, in one area (the unit touch electrode area) where each of the plurality of electrodes S11 to S14, S21 to S24 and S31 to S34 acting as the common electrodes and the touch electrodes is formed, 24×3 data lines DL and 24 gate lines GL may be disposed to define 24×3×24 pixels P.

Meanwhile, each of the plurality of electrodes S11 to S14, S21 to S24 and S31 to S34 acting as the common electrodes and the touch electrodes may have a pattern of a block as shown in FIG. 3, or a pattern of a comb in some cases.

Further, the present invention may be applied to a case where each of the plurality of electrodes S11 to S14, S21 to S24 and S31 to S34 acting as the common electrodes and the touch electrodes has a pattern including a comb shape.

Although the plurality of electrodes S11 to S14, S21 to S24 and S31 to S34 acting as the common electrodes and the touch electrodes is illustrated to be twelve electrodes in a matrix of three rows and four columns in the drawings of the present specification, this is just an example for the convenience of explanation, and the plurality of electrodes acting as the common electrodes and the touch electrodes may be formed by various numbers and in various matrix forms, considering the size of the display device 100 integrated with a touch screen panel and the panel 100, and design criteria of a touch system.

Figure 4:
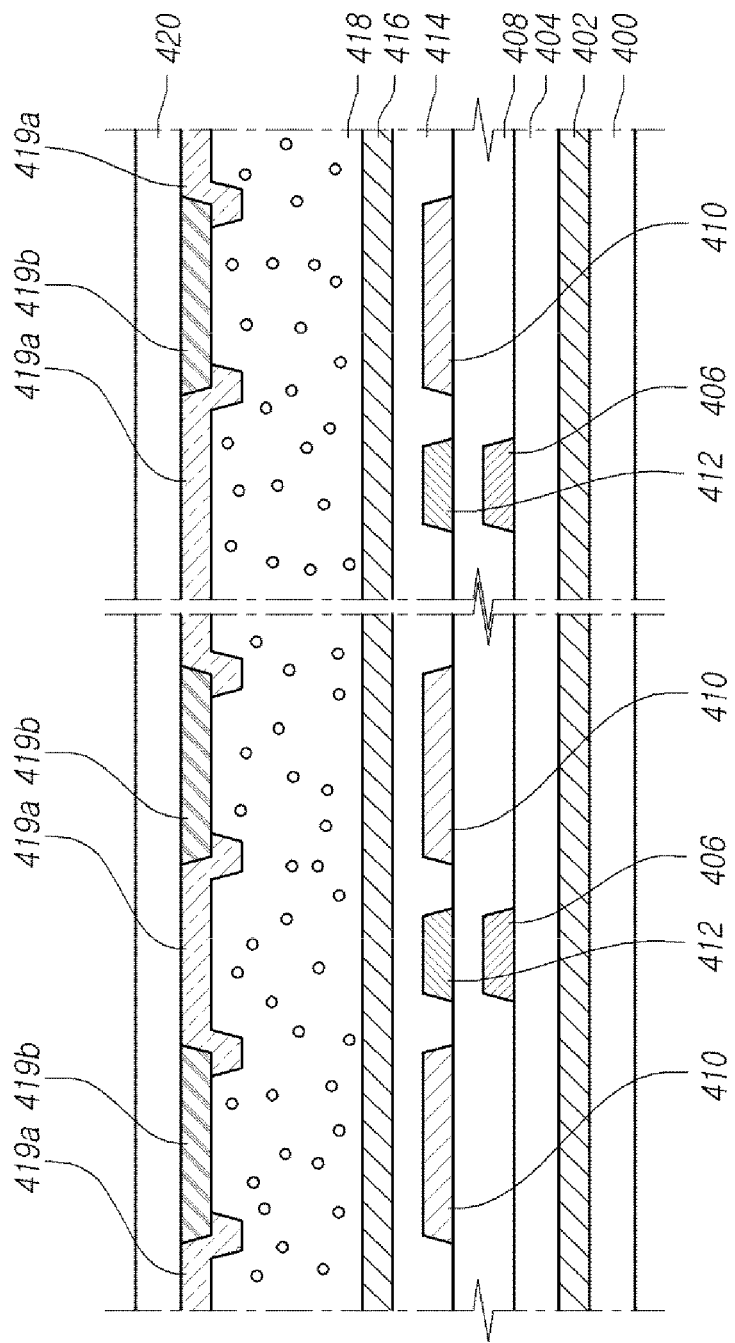
FIG. 4 illustrates an example of a sectional view of a panel in a case where a display device integrated with a touch screen panel is a liquid display device according to an embodiment of the present invention.

FIG. 4 illustrates an example of a sectional view of a panel in a case where a display device integrated with a touch screen panel is a liquid display device according to an embodiment of the present invention.

FIG. 4 shows a sectional view of an area (the unit touch electrode area) where a single electrode among the plurality of electrodes S11 to S14, S21 to S24 and S31 to S34 acting as the common electrodes and the touch electrodes is formed.

Referring to FIG. 4, on the panel 110 of the display device 100 integrated with a touch screen panel according to an embodiment of the present invention, gate lines 402 are formed on a lower substrate 400 in the first direction (in the lateral direction, i.e., to the left and right in FIG. 4), and a gate insulator 404 is formed thereon.

Data lines 406 are formed on the gate insulator 404 in the second direction (in the longitudinal direction, i.e., the direction perpendicular to the paper in FIG. 4), and the first protective layer 408 is formed thereon.

A pixel electrode 410 and a signal line 412 of each pixel area may be formed on the first protective layer 408, and the second protective layer 414 may be formed thereon. Here, the signal line 412 leads from each of the plurality of electrodes S11 to S14, S21 to S24 and S31 to S34 acting as the common electrodes and the touch electrodes to the touch integrated circuit 140 to transfer the common voltage Vcom generated in the common voltage supplier to the plurality of electrodes S11 to S14, S21 to S24 and S31 to S34 in the display driving mode, and to transfer the touch driving signal generated in the touch integrated circuit 140 to the plurality of electrodes S11 to S14, S21 to S24 and S31 to S34 in the touch driving mode.

A single electrode 416 acting as the common electrode and the touch electrode is formed on the second protective layer 414, and a liquid crystal layer 418 is formed thereon. Here, the electrode 416 acting as the common electrode and the touch electrode may be one of the plurality of electrodes S11 to S14, S21 to S24 and S31 to S34 and may have a block pattern.

An upper substrate 420 having a black matrix 419A and a color filter 419B formed thereon is positioned on the liquid crystal layer 418.

Although FIG. 4 illustrates a liquid crystal display device, the present invention is not limited thereto and may be applied to various display devices that adopt a touch panel.

Figure 5:
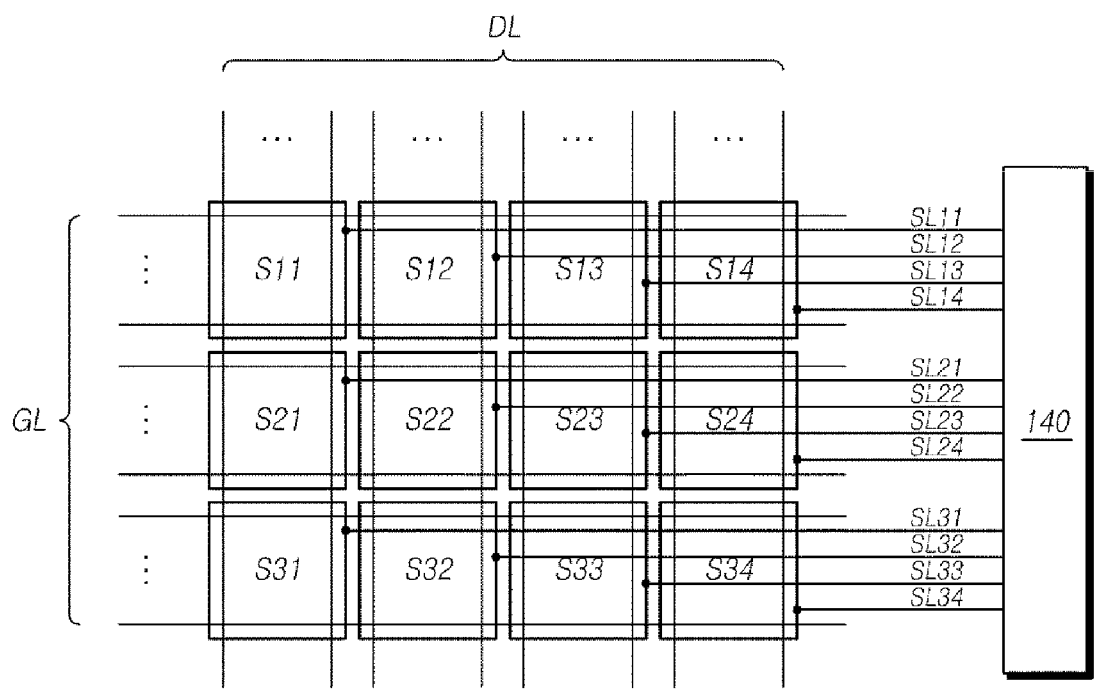
FIG. 5 is another plan view of a panel included in a display device integrated with a touch screen panel according to an embodiment of the present invention.

FIG. 5 is another plan view of a panel included in a display device integrated with a touch screen panel according to an embodiment of the present invention.

Referring to FIG. 5, differently from the configuration of FIG. 3, signal lines SL11 to SL14, SL21 to SL24 and SL31 to SL34, which are connected with the plurality of electrodes S11 to S14, S21 to S24 and S31 to S34 to transfer the touch driving signal or the common voltage, may be formed in the second direction (e.g., lateral direction) in which the gate lines GL are formed.

In this case, the touch driving signal generated in the touch integrated circuit 140 or the common voltage generated or supplied from the common voltage supplier may be transferred to all or some of the plurality of electrodes S11 to S14, S21 to S24 and S31 to S34 through the signal lines SL11 to SL14, SL21 to SL24 and SL31 to SL34 that are formed to be parallel with the gate lines.

Hereinafter, a method for manufacturing the signal lines SL11 to SL14, SL21 to SL24 and SL31 to SL34 (hereinafter, referred to as touch signal lines) in FIG. 3 or FIG. 5, which transfer the touch driving signal to the common electrode as described in FIGS. 1 to 5, and a fabricating method of the present invention, by which the manufacturing process can be simplified, will be described.

The touch signal lines may be formed in a conductive metal layer M3L (or the third conductive layer) in the process.

As described above, additional signal lines are required to form electrodes for providing the common voltage, which are grouped and blocked in the in-cell type, and this may bring about the increase in masks necessary for the formation of the signal lines. In order to reduce the number of masks, the first electrode (pixel electrode), a conductive metal layer for the touch signal lines and a thin film transistor protective layer (planarization layer or overcoat layer) formed on the thin film transistor may be etched at once, and the first electrode protective layer (e.g., the second protective layer) and the first protective layer may be selectively etched at once. Further, the first connection pattern, which connects the first electrode to the source electrode or the drain electrode of the thin film transistor, may be made of the same material as the second electrode at the same time as the second electrode. Now, the process and the structure thereof will be described.

In the present invention, the thin film transistor may be formed on the substrate by amorphous silicon (hereinafter, referred to as "a-Si"), metal oxides and poly silicon including low temperature poly silicon (hereinafter, referred to as "LTPS") and High temperature poly silicon (hereinafter, referred to as "HTPS"), but the present invention is not limited thereto.

Figure 6:
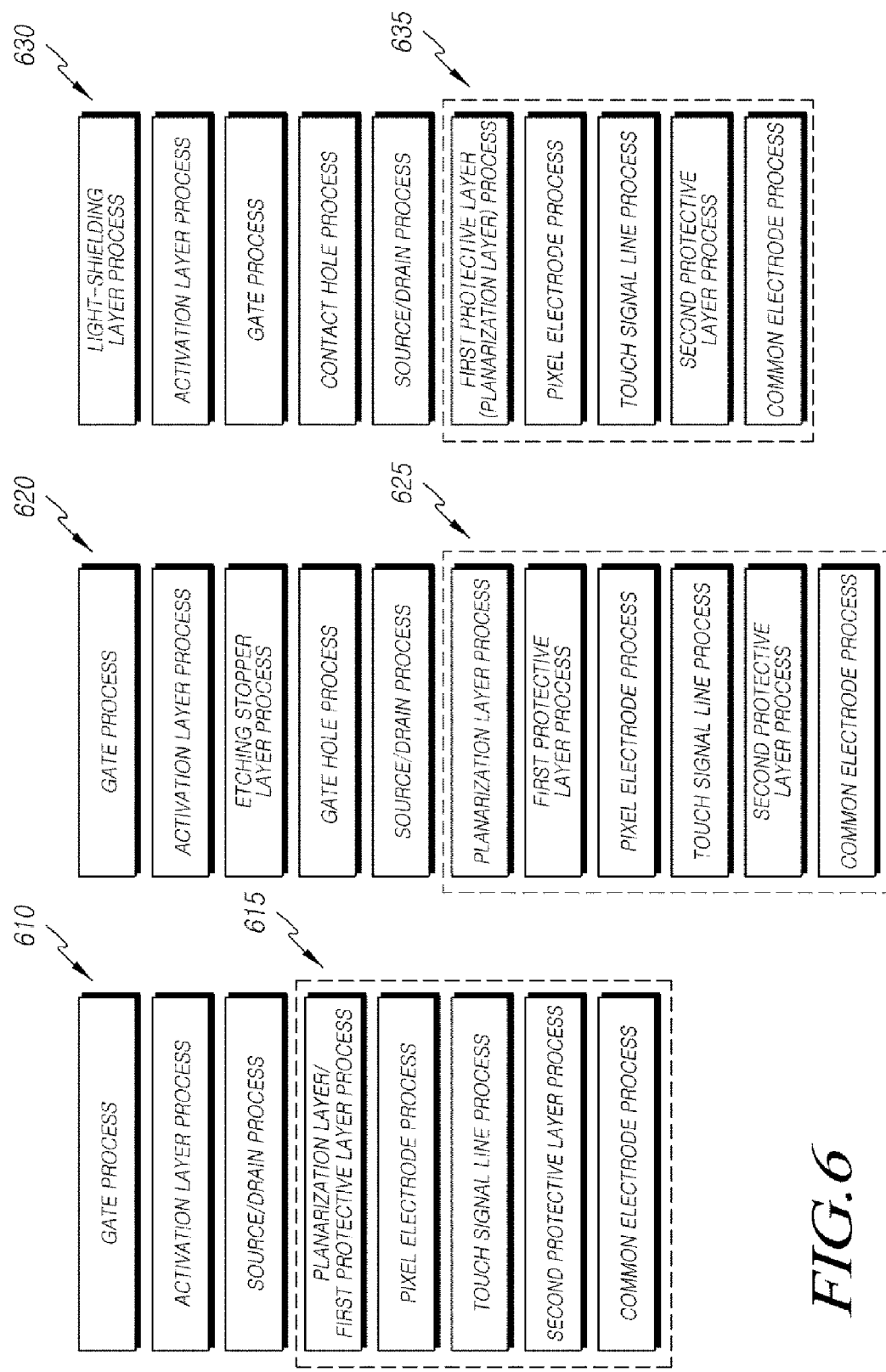
FIG. 6 is a diagram illustrating processes of manufacturing a thin film transistor on a substrate.

FIG. 6 is a diagram illustrating processes of manufacturing a thin film transistor on a substrate.

A reference numeral 610 shows one of the methods for manufacturing the thin film transistor substrate of a-Si, by which the gate electrode and the activation layer are formed, then the source electrode and the drain electrode are formed, and then a planarization layer, the first protective layer, the pixel electrode, the touch signal line, the second protective layer and the common electrode are formed in sequence 615.

A reference numeral 620 illustrates one of the methods for manufacturing the thin film transistor substrate of metal oxides, by which the gate electrode, the activation layer, an etching stopper layer and a gate hole (G-hole) are formed, then the source electrode and the drain electrode are formed, and then the planarization layer, the first protective layer, the pixel electrode, the touch signal line, the second protective layer and the common electrode are formed in sequence 625.

A reference numeral 630 shows one of the methods for manufacturing the thin film transistor substrate of LTPS, by which a light-shielding (LS) layer, the activation layer, the gate electrode, the contact hole, the source electrode and the drain electrode are formed, and then the first protective layer (or planarization layer), the pixel electrode, the touch signal line, the second protective layer and the common electrode are formed in sequence 635.

Figure 7:
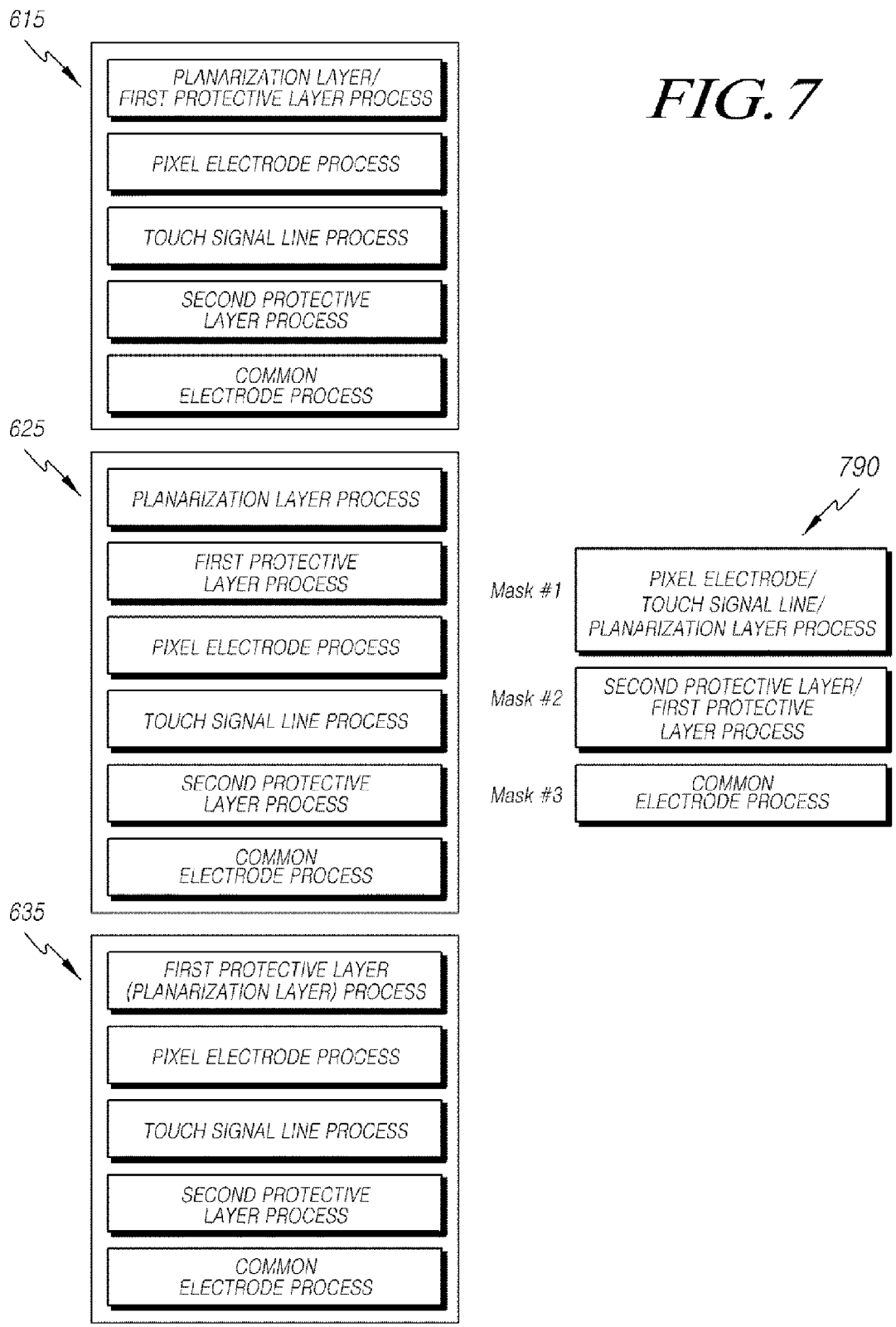
FIG. 7 is a diagram illustrating examples of processes according to the present invention.

FIG. 7 is a diagram illustrating examples of processes according to the present invention. Processes 615, 625 and 636 of FIG. 6 may be modified as shown in FIG. 7.

In an embodiment of the present invention, a single mask (Mask #1) is used for forming the pixel electrode, the touch signal line and the planarization layer, and another single mask (Mask #2) is used for forming the second protective layer and the first protective layer, as indicated by a reference numeral 790.

Next, another single mask (Mask #3) is used for forming the common electrode Vcom or Vdd. As a result, while the processes 615, 625 and 635 have five operations, six operations and five operations, respectively, the embodiment of the present invention has three operations only.

The planarization layer of FIG. 7 is an example of the thin film transistor protective layer, and the planarization layer may be replaced with an overcoat layer. The pixel electrode is an example of the first electrode, and the second protective layer is an example of the first electrode protective layer. Further, the common electrode is an example of the second electrode.

As shown in FIG. 7, the common operations with respect to the substrate in FIG. 6 may be reduced by using three masks.

Figure 8A:
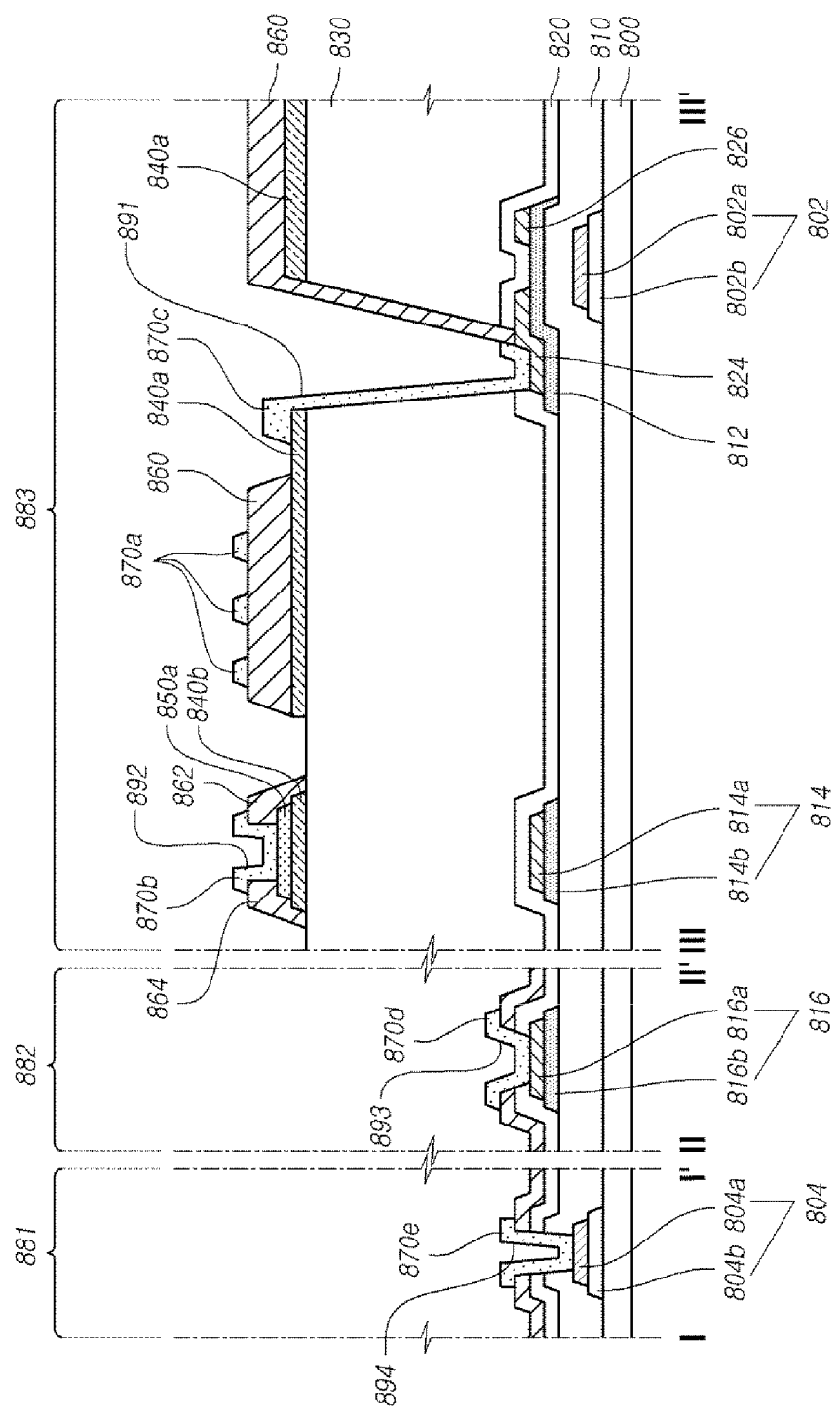
FIGS. 8A and 8B are sectional views illustrating configurations of a pixel portion, a gate pad portion and a data pad portion of a display device according to an embodiment of the present invention.
Figure 8B:
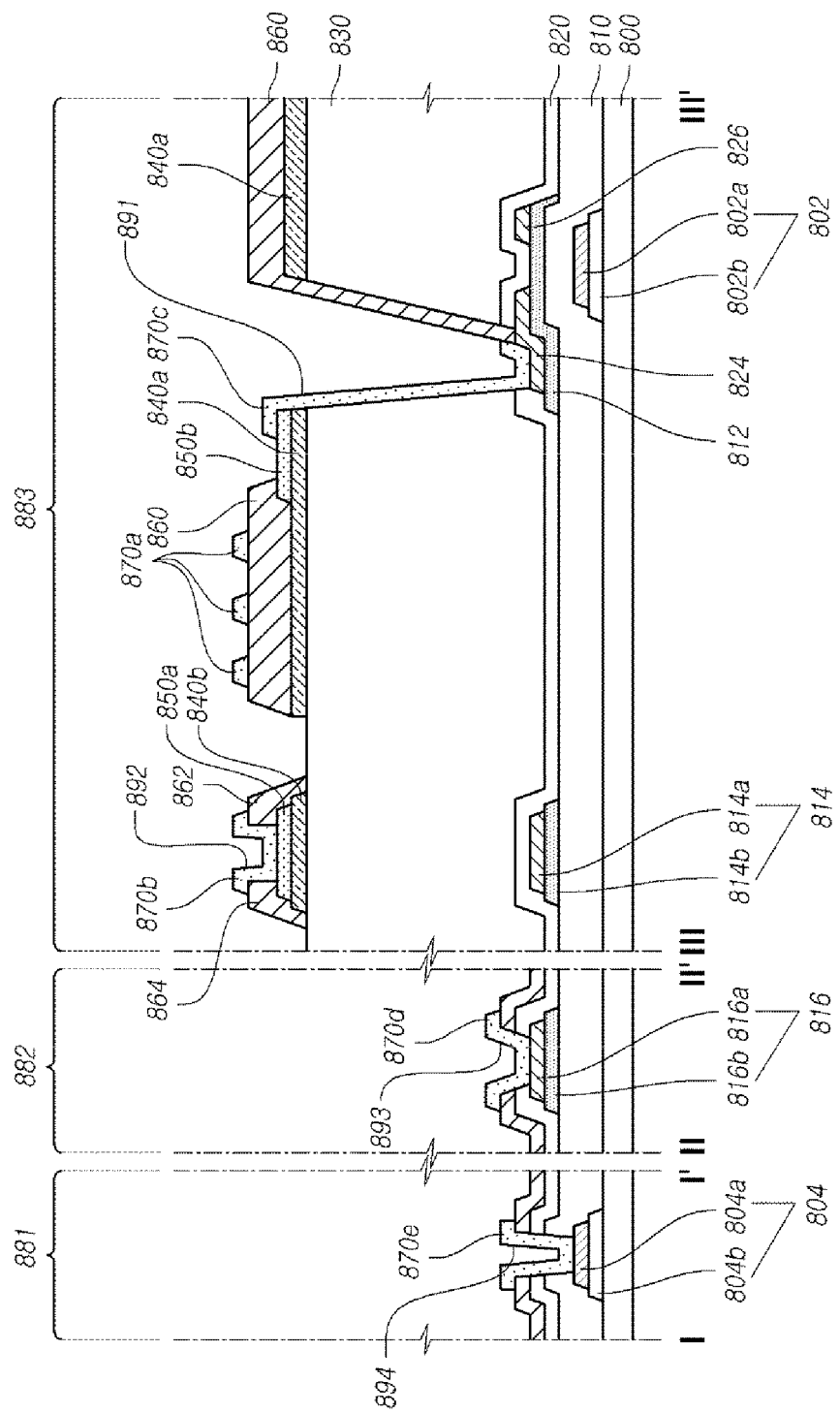

FIGS. 8A and 8B are sectional views illustrating configurations of a pixel portion, a gate pad portion and a data pad portion of a display device according to an embodiment of the present invention.

All elements of FIG. 8A are the same as those of FIG. 8B except for the second connection pattern 850b.

A gate pad portion 881 and a data pad portion 882 may be made of the same material and by the same process as those of the thin film transistor formed on the pixel portion 883.

Referring to FIG. 8A showing the first embodiment of the present invention, a gate electrode 802 is positioned on a substrate 800 in the pixel portion 883 of the display according to an embodiment of the present invention. The gate electrode 802 may be formed as double electrodes 802a and 802b of a conductive metal layer and a transparent conductive material layer, but the gate electrode is not limited thereto and may be a single electrode or multiple electrodes.

In addition, gate lines 804a and 804b are made of the same material as that of the gate electrode 802 on the substrate 800 in the gate pad portion 881.

A gate insulator 810 is formed on the gate electrode 802 and the gate line 804 for the gate pad. Further, an activation layer 812 (or active layer), a source electrode 824 and a drain electrode 826 are formed on the gate insulator 810. In addition, data lines 814A and 814B and data lines 816a and 816b for the data pad portion 882 are positioned on the gate insulator 810.

The first protective layer 820 and a thin film transistor protective layer 830 are accumulated on the source electrode 824, the drain electrode 826 and the data lines 814A, 814B, 816a and 816b in sequence. The first protective layer 820 may be omitted and only the thin film transistor protective layer 830 may be accumulated, according to the embodiment. The example of the thin film transistor protective layer 830 includes the planarization layer or the overcoat layer.

The first electrode 840a of which the example is the pixel electrode, and the first touch connection pattern 840b that is made of the same material and by the process as those of the first electrode are positioned on the thin film transistor protective layer 830. Reference numerals 850a of FIG. 8A, 850a and 850b of FIG. 8B denote conductive metal layers, and a reference numeral 850a of FIGS. 8A and 8B constitutes the touch signal line. The touch signal line 850a is positioned on the first touch connection pattern 840c and contacts with the second touch connection pattern 870b to transfer the touch driving signal to the second electrode 870a.

The second electrode 870a, of which the example is the common electrode, is formed, and the first connection pattern 870c and the second connection pattern 870b are formed of the same material and by the same process as those of the second electrode.

The first connection pattern 870c of FIG. 8A showing the first embodiment of the present invention connects one of the source electrode 824 and the drain electrode 826 with the first electrode 840a.

The first connection pattern 870c of FIG. 8B showing the second embodiment of the present invention is formed on the second connection pattern 850b to contact with one of the source electrode 824 and the drain electrode 826. Further, the second connection pattern 850b is made of the same material and by the same process as those of the touch signal line 850a on the first electrode 840a.

The first electrode protective layers 860, 862 and 864 are formed on the first electrode 840a, the first touch connection pattern 840b, the touch signal line 850a and the second connection pattern 850b, and they may be the second protective layer as shown in the previous embodiment. The second electrode 870a and the second touch connection pattern 870b on the first electrode protective layer 860, the data pad connection portion 870d and the gate pad connection portion 870e are formed. Further, the first connection pattern 870c is made of the same material and by the same process as those of the second electrode 870a by using the same mask.

The second electrode 870a may operate as the common electrode in the display driving mode and operate as the touch electrode applied with the touch driving signal in the touch driving mode.

In addition, the first contact hole 891, the second contact hole 892, the third contact hole 893 and the fourth contact hole 894 are formed in FIGS. 8A and 8B, which will be described later.

The display device of the present invention in FIGS. 8A and 8B will be described in a view of the thin film transistor, hereinafter.

With regard to essential elements constituting the present invention, the gate lines positioned for transferring the gate signals and the data lines for transferring the data signals are positioned in the first direction and the second direction, respectively, on the substrate. Also, the thin film transistor is formed at each pixel defined by the intersection of the gate lines and the data lines. The first electrode is positioned to be spaced from one of the source electrode or the drain electrode of the thin film transistor, and one example of the first electrode may be the pixel electrode as described above. In addition, the second electrode is positioned to face the first electrode, and one example of the second electrode may be the common electrode.

As set forth above, when the display device is in the display driving mode, the second electrode operates as the common electrode that is applied with the common voltage. Also, when the display device is in the touch driving mode, the second electrode operates as the touch electrode that is applied with the touch driving signal.

The first contact hole is formed on the thin film transistor protective layer of the thin film transistor. Further, the touch signal line is formed between the first touch connection pattern, which is made of the same material as that of the first electrode to be separated from the first electrode, and the second touch connection pattern, which is made of the same material of the second electrode to be connected with the second electrode. The touch signal line transfers the touch driving signal to the second touch connection pattern. Here, the touch signal line may be formed in the conductive metal layer, and may be formed at the same time as the thin film transistor protective layer by using a single mask after accumulating the first electrode (pixel electrode), as described later.

The first connection pattern is made of the same material as that of the second electrode and connects the first electrode with the source electrode or the drain electrode through the first contact hole. Afterwards, the first protective layer is formed on the first electrode and the touch signal line.

The second connection pattern 850b of FIG. 8B showing the second embodiment of the present invention is made of the same material and by the same process as those of the touch signal line to be positioned between the first connection pattern and the first electrode.

In addition, the second touch connection pattern is positioned on the touch signal line through the second contact hole formed in the first protective layer. At this time, the width of the touch signal line is narrower than the first touch connection pattern, and the first electrode protective layer is positioned at the edge of the width of the touch signal line. Further, the second contact hole is formed in the first electrode protective layer to expose the touch signal line.

In addition, the data pad connection portion and the gate pad connection portion are made of the same material and by the same process as those of the second electrode. More specifically, the data pad connection portion is positioned through the third contact hole in the first electrode protective layer, and the gate pad connection portion is positioned through the fourth contact hole in the first electrode protective layer.

Meanwhile, FIGS. 8A and 8B show the gate pad portion 881 and the data pad portion 882. Now, the display device including the data driving portion (see 120 of FIG. 1) and the gate driving portion (see 130 of FIG. 1), which are connected with the gate pad portion 881 and the data pad portion 882, respectively, will be described.

Basically, the display device has N×P thin film transistors, N×p first electrodes (e.g., pixel electrodes) connected with the source electrodes or the drain electrodes of the thin film transistors to be spaced therefrom, and P second electrodes (e.g., common electrodes) facing the first electrodes to provide the same signal to N pixels. The more detailed description will follow below.

The thin film transistor is positioned at each of N×P pixels that are defined by the intersection of the gate lines, which are positioned in the first direction on the substrate to transfer the gate signals, and the data lines, which are positioned in the second direction on the substrate to transfer the data signals. Also, the first electrode is spaced from one of the source electrode and the drain electrode of the thin film transistor. Meanwhile, P second electrodes face the first electrodes and provide the same signal to N pixels. Further, the thin film transistor protective layer (e.g., planarization layer or OC layer) is positioned on the thin film transistor, and the first contact hole is formed in the thin film transistor protective layer. The first connection pattern is formed to connect the first electrode with the source electrode or the drain electrode through the first contact hole. Further, the touch signal line is positioned between the first touch connection pattern and the second touch connection pattern and transfers the touch driving signal to the second touch connection pattern. The first touch connection pattern is made of the same material as that of the first electrode to be separated from the first electrode. Furthermore, the second touch connection pattern is made of the same material as that of the second electrode to be connected with the second electrode.

The first connection pattern connects the first electrode with the source electrode or the drain electrode in the pixel area. Accordingly, the first connection pattern is made of the same material as that of the second electrode and connects one of the source electrode and the drain electrode with the first electrode through the first contact hole. The first connection pattern may exist by the number corresponding to the pixels, that is, N×P first connection pattern may be provided.

In addition, the display device includes the first electrode protective layer formed on the first electrode and the touch signal line.

A plurality of the second electrodes may be applied with the touch driving signal. The touch integrated circuit applies the touch driving signal to all or some of the plurality of the second electrodes in the touch driving mode of the display panel. Further, the data driving portion supplies the data voltage to a plurality of data lines in the display driving mode, and the gate driving portion sequentially supplies scan signals to a plurality of gate lines in the display driving mode.

The second connection pattern is positioned between the first connection pattern and the first electrode and is made of the same material as that of the touch signal line, as set forth above. Further, the second touch connection pattern of the display panel is positioned on the touch signal line through the second contact hole formed in the first electrode protective layer. Meanwhile, the width of the touch signal line of the display panel is narrower than the first touch connection pattern, and the first electrode protective layer is positioned at the edge of the width of the touch signal line. The second contact hole is positioned in the first electrode protective layer and it can make the touch signal line exposed, which may be influenced by which is the upper layer. The data pad connection portion and the gate pad connection portion of the display device may be made of the same material as that of the second electrode. The data pad connection portion is positioned through the third contact hole in the first electrode protective layer of the display panel, and the gate pad connection portion is positioned through the fourth contact hole in the first electrode protective layer of the display panel.

Referring to the second electrode in more detail, the second electrode acts as the common electrode, which is applied with the common voltage, in the display driving mode of the display device, and acts as the touch electrode, which is applied with the touch driving signal, in the touch driving mode of the display device.

FIGS. 9A to 9E are plan views illustrating configurations of a pixel portion, a gate pad portion and a data pad portion of a display device according to an embodiment of the present invention. In FIGS. 9A to 9E, the thin film transistor protective layer (e.g., planarization layer or overcoat layer), the first electrode protective layer (e.g., the second protective layer), the first protective layer and the gate insulator are not illustrated for the convenience of explanation.

Figure 9A:
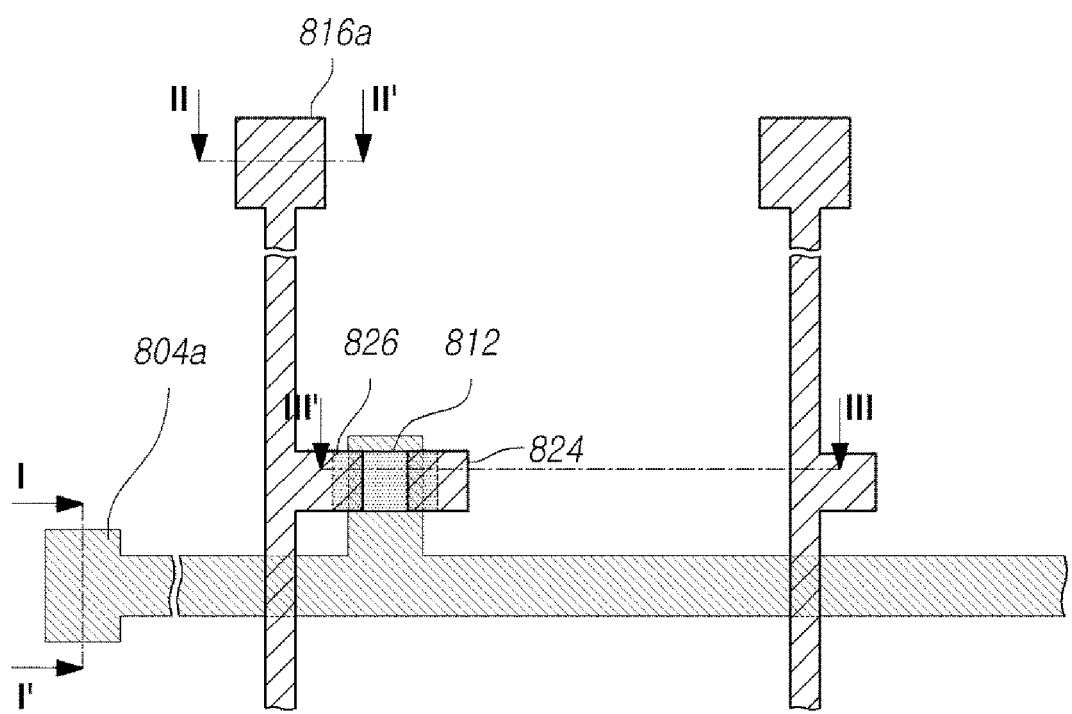
FIGS. 9A to 9E are plan views illustrating configurations of a pixel portion, a gate pad portion and a data pad portion of a display device according to an embodiment of the present invention.
Figure 9B:
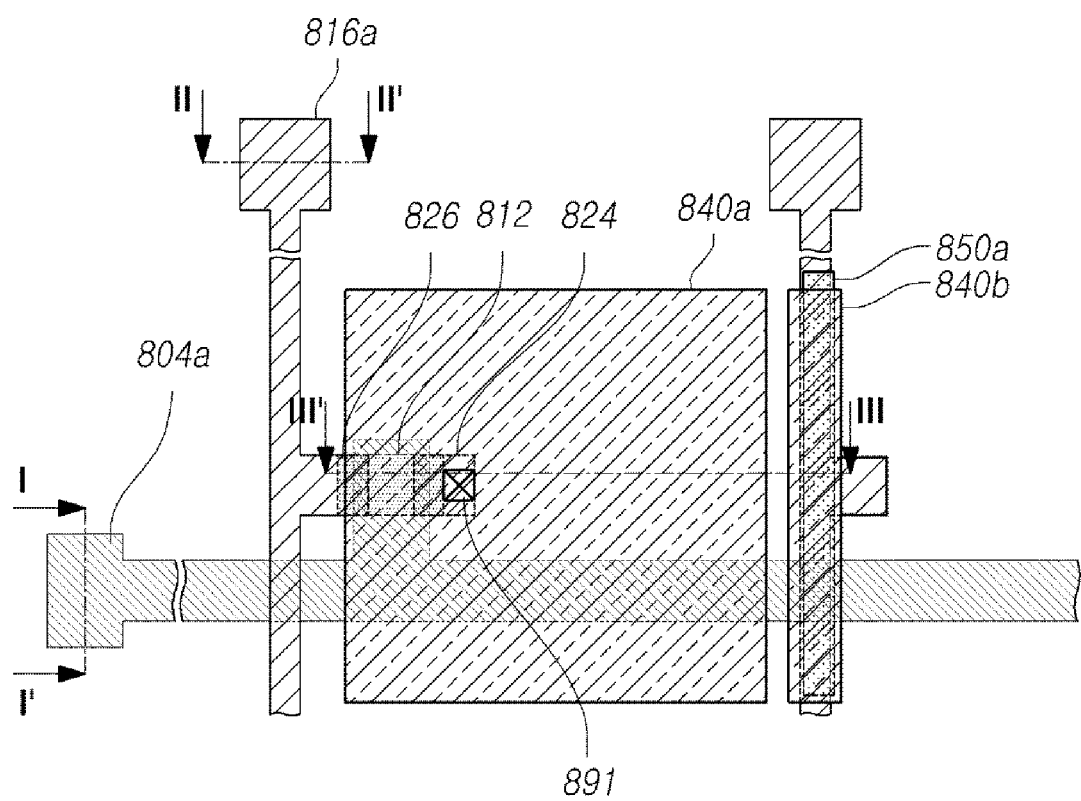
Figure 9C:
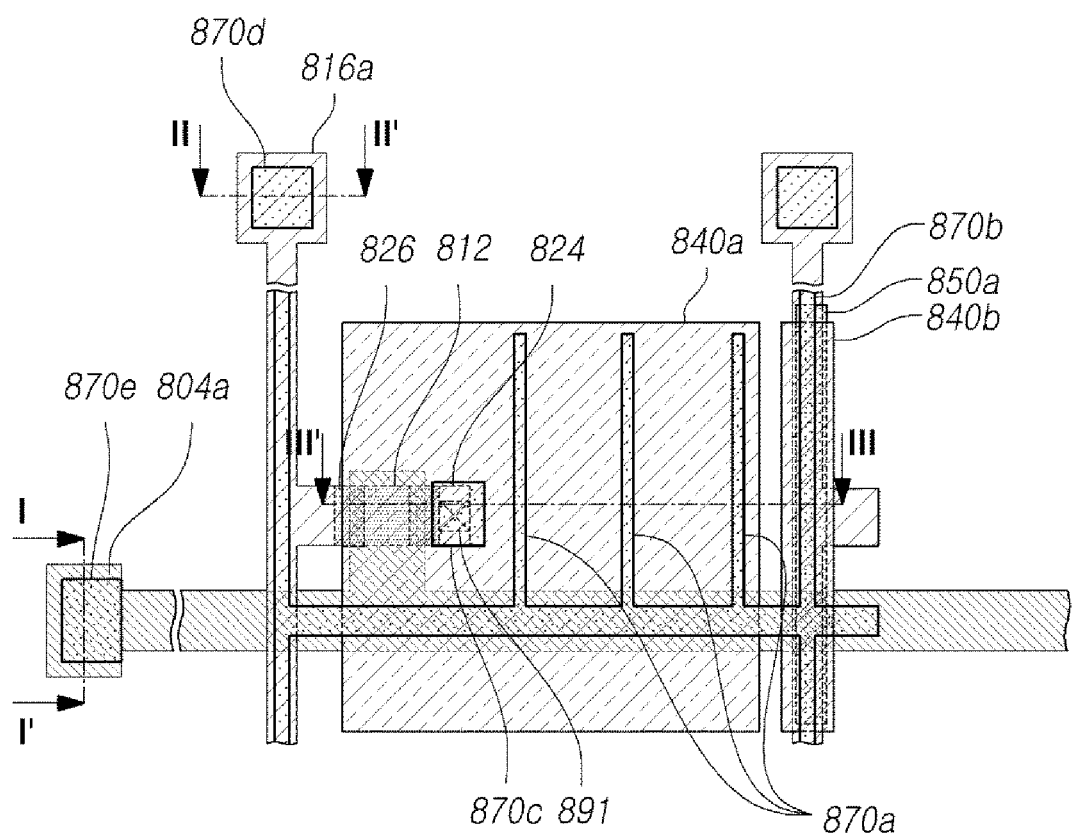

FIGS. 9A, 9B and 9C show plan views of the process of forming the first embodiment of the present invention in FIG. 8A, and FIGS. 9A, 9D and 9E show plan views of the process of forming the second embodiment of the present invention in FIG. 8B. Here, FIG. 9A is applied to both embodiments in common.

Now, the first embodiment of the present invention will be described.

FIG. 9A is a plan view in which the data line, the gate line and the thin film transistor are formed. The data line 816*a* for the data pad portion, the gate line 804*a* for the gate pad portion, the source electrode 824, the drain electrode 826 and the activation layer 812 are formed. The layers of FIG. 9A are accumulated under the first protective layer 820 of FIG. 11 as described later.

FIG. 9B is a plan view in which the first electrode 840*a* and the first touch connection pattern 840*b* are made of the same material, and the touch signal line 850*a* is formed on the first touch connection pattern 840*a*. Further, the first contact hole 891 is formed to allow the first electrode 840*a* to contact with the source electrode 824. The layers of FIG. 9B will be shown in FIG. 12E.

FIG. 9C shows that the second electrode 870*a* and the first connection pattern 870*c* are made of the same material, and the second touch connection pattern 870*b*, the data pad connection portion 870*d* and the gate pad connection portion 870*e* are formed of the same material as that of the second electrode 870*a*. The first connection pattern 870*c* connects the first electrode 840*a* with the source electrode 824 through the first contact hole 891. The accumulation structure thereof will be shown in FIG. 8A.

Now, the second embodiment of the present invention will be described.

Figure 9D:
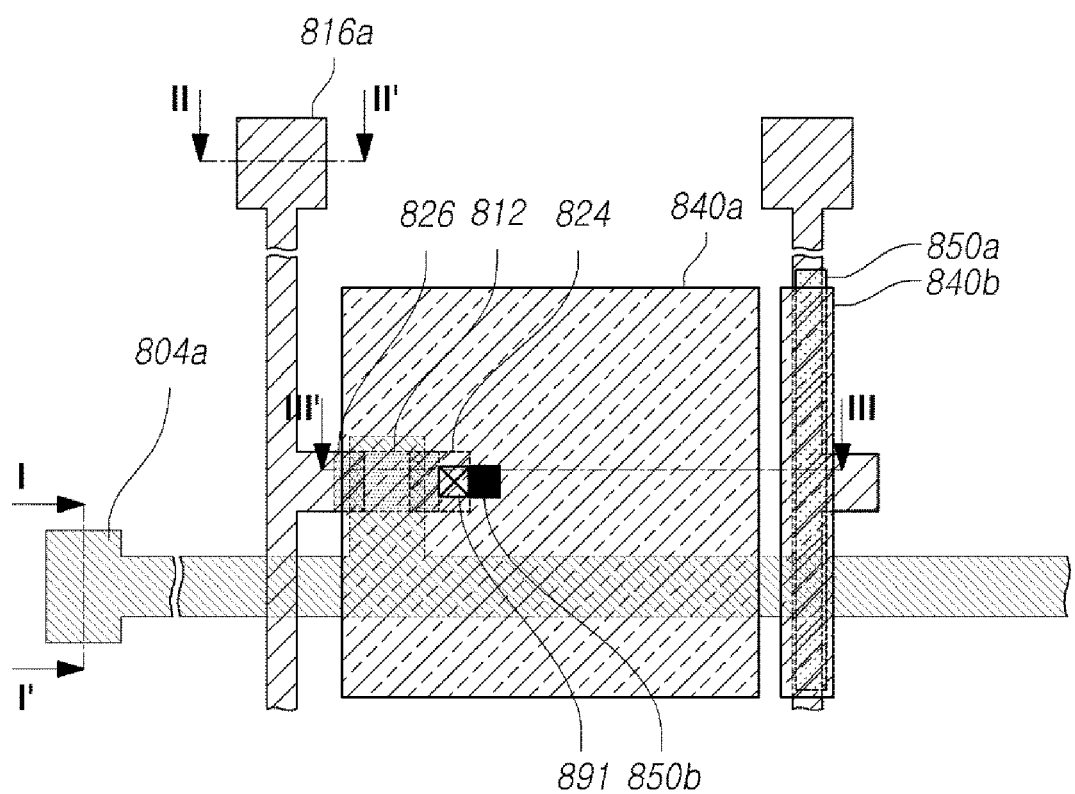

After the thin film transistor is formed as shown in FIG. 9A, the first electrode 840*a* and the first touch connection pattern 840*b* are formed of the same material, and the touch signal line 850*a* is formed on the first touch connection pattern 840*a*, as shown in FIG. 9D. In addition, the first contact hole 891 is formed to allow the first electrode 840*a* to contact with the source electrode 824. Further, the second connection pattern 850*b* is formed of the same material as that of the touch signal line 850*a* to be adjacent to the first contact hole 891 on the first electrode 840*a*. The accumulation structure of FIG. 9D will be shown in FIG. 14E.

Figure 9E:
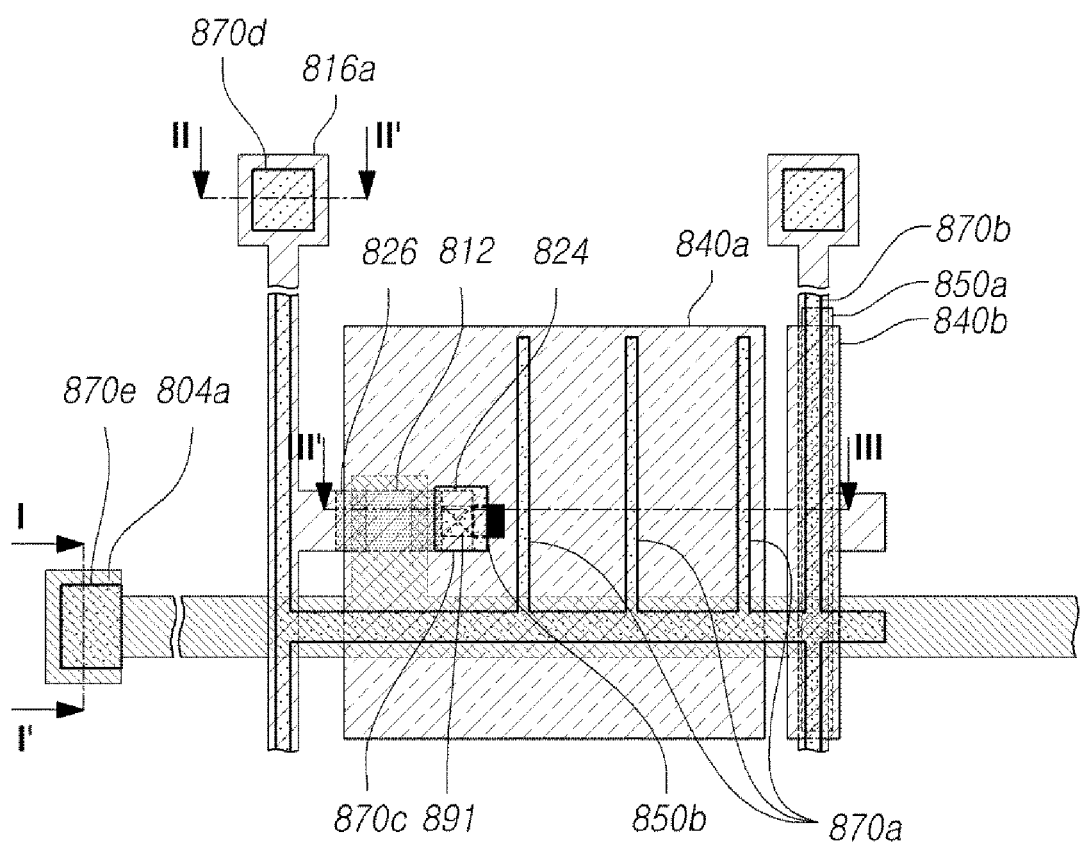

FIG. 9E shows that the second electrode 870*a* and the first connection pattern 870*c* are formed of the same material, and the second touch connection pattern 870*b*, the data pad connection portion 870*d* and the gate pad connection portion 870*e* are formed of the same material as that of the second electrode 870*a*. The first connection pattern 870*c* connects the second connection pattern 850*b* formed on the first electrode 840*a* with the source electrode 824 through the first contact hole 891. The accumulation structure thereof is the same as shown in FIG. 8B.

Figure 10:
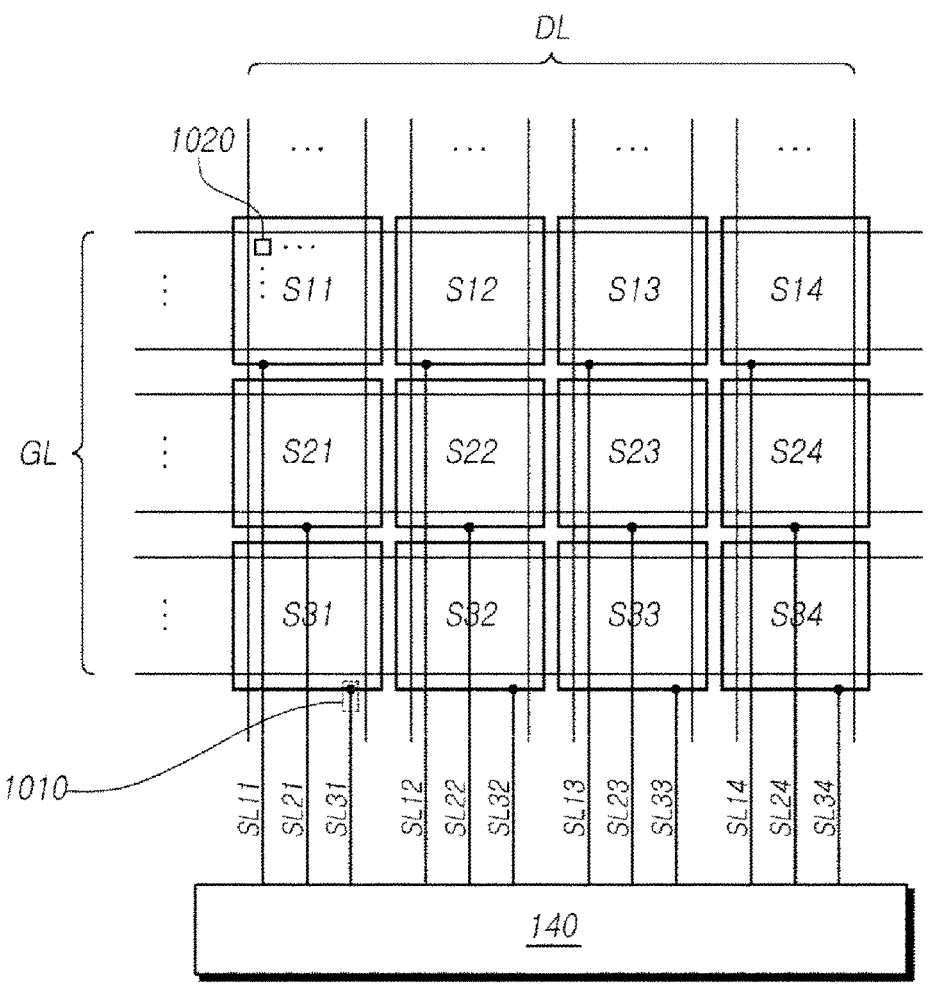
FIG. 10 is a sectional view illustrating a configuration of a display device according to an embodiment of the present invention.

FIG. 10 illustrates a configuration of a display according to an embodiment of the present invention.

More specifically, in FIG. 10, N×P pixels and thin film transistors thereof are formed at the crossings of the data lines and the gate lines. Further, P common electrodes exist at the area formed by grouping N pixels. P common electrodes have a pixel area 1010 which shows the pixel where the first touch connection pattern, the second touch connection pattern and the touch signal line exist. The normal pixel area 1020 does not have the connection pattern between the touch signal line and the common electrode. The normal pixel area may selectively include the first connection pattern. Further, the second connection pattern, and the first connection pattern are made of the same material as that of the common electrode and the second connection pattern is made of the same material as that of the touch signal line as described above.

Now, the process of forming the first connection pattern 870*a* and the second connection pattern 850*b* in FIGS. 8A and 8B with the decrease in the number of masks will be described below.

Figure 11:
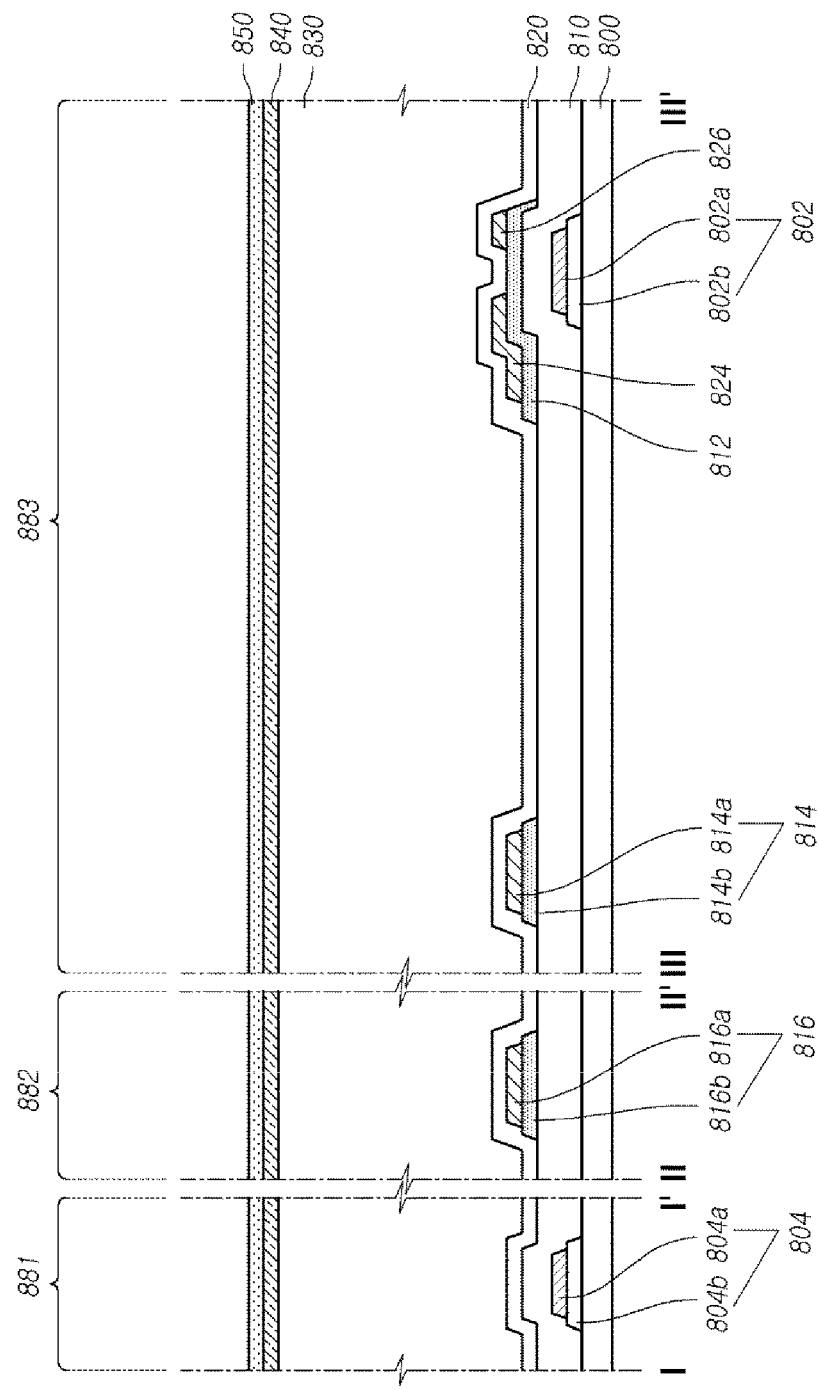
FIG. 11 illustrates accumulation of a thin film transistor, the first protective layer, a thin film transistor protective layer and the first electrode.

FIG. 11 illustrates accumulation of a thin film transistor, the first protective layer, a thin film transistor protective layer and the first electrode.

The gate electrode 802 is formed as double electrodes 802*a* and 802*b* on the substrate 800, and the gate line 804, which is connected with the gate pad connection portion to which the gate driving portion is connected, is formed as double electrodes 804*a* and 804*b* in the same process.

The conductive metal layers 802a and 804a may be made of at least one selected from the group of conductive metal including aluminum (Al), copper (Cu), molybdenum (Mo), chromium (Cr), titanium (Ti), moly-tungsten (MoW), moly-titanium (MoTi) and copper/moly-titanium (Cu/MoTi), but may not be limited thereto. In addition, transparent conductive material layers 802b and 804b may be made of one selected from the group including Indium Tin Oxides (ITO), Indium Zinc Oxides (IZO) and carbon nano-tubes (CNT), but may not be limited thereto. The electrodes 802 and 804 are not limited to the double electrodes, and may be formed as a single electrode.

The electrodes 802 and 804 of FIG. 11 may be formed by a single mask during the formation of the gate lines. In addition, the gate insulator 810 may be formed on the electrodes 802 and 804.

The activation layer 812, the source electrode 824 and the drain electrode 826 are formed on the gate insulator, and at the same time, the data lines 814 and 816 are formed. At this time, a single mask may be used.

More specifically, the activation layer 812 may be formed of, for example, semiconductor materials, such as amorphous silicon or poly silicon, such as LTPS, HTPS, or the like. In addition, the activation layer 812 may be formed of oxide semiconductor materials, such as Zinc Oxides (ZO), Indium Galium Zinc Oxides (IGZO), Zinc Indium Oxides (ZIO), Ga-doped-ZnO (ZGO), or the like Further, the source electrode 824 and the drain electrode 826 are simultaneously formed by using process of forming a thin film, such as sputtering or deposition, to thereby complete the thin film transistor.

The first protective layer 820 is formed on the thin film transistor. The first protective layer 820 may be formed of inorganic materials, such as SiO2 and SiNx, or organic materials, such as photo acrylic, but the present invention is not limited thereto.

In addition, the thin film transistor protective layer 830 is formed on the first protective layer 820. The planarization layer as an example of the thin film transistor protective layer 830 may have tens to hundreds of permittivity and may be made of light rare earth oxides, such as LaAlO3, La2O3, Y2O3 and LaAl3O6, rare earth compound oxides, or barium strontium titanate (BST) oxides, but the present invention is not limited thereto. Further, the thin film transistor protective layer 830 may be formed as the overcoat layer by using organic materials. Unevenness between the electrodes may be compensated by the thin film transistor protective layer 830, such as the planarization layer or the overcoat layer, to be thereby flattened.

The first electrode layer 840 is formed on the thin film transistor protective layer 830. The first electrode layer 840 may be made of transparent conductive materials, such as ITO, IZO and ITZO. The first electrode layer 840 provides a function of the pixel electrode through the later process and is connected with the source electrode 824 or the drain electrode 826.

The conductive metal layer 850 for the touch signal line is formed on the first electrode layer 840. The conductive metal layer 850 is turned to be the touch signal line 850a and the second connection pattern 850b through a predetermined etching process.

Photoresist is coated in order to create a photoresist pattern by a photo lithography process. After that, a mask having a light penetration area and a light-shielding area is covered on the photoresist, and then is exposed to the light to create a desired pattern of the photoresist. The light penetrating the light penetration area makes the photoresist hard and the remaining area is developed, or vice versa.

The fabrication of layers in FIG. 8A according to the first embodiment of the present invention will be described in detail. The beginning of the process is shown in FIG. 11 and followed by the process shown in FIGS. 12A to 13E.

FIGS. 12A to 12F illustrate a process of forming the first electrode, a touch signal line and a thin film transistor protective layer according to the first embodiment of the present invention.

The process 790 of FIG. 7, by which the first electrode (pixel electrode), the touch signal line and the thin film transistor protective layer (planarization layer or overcoat layer) are formed by using a single mask (Mask #1), will be described with reference to FIGS. 12A to 12F.

FIG. 11 shows the beginning of the process.

FIG. 12A shows that photoresist 1210 is coated on the conductive metal layer 850 formed in FIG. 11.

Figure 12B:
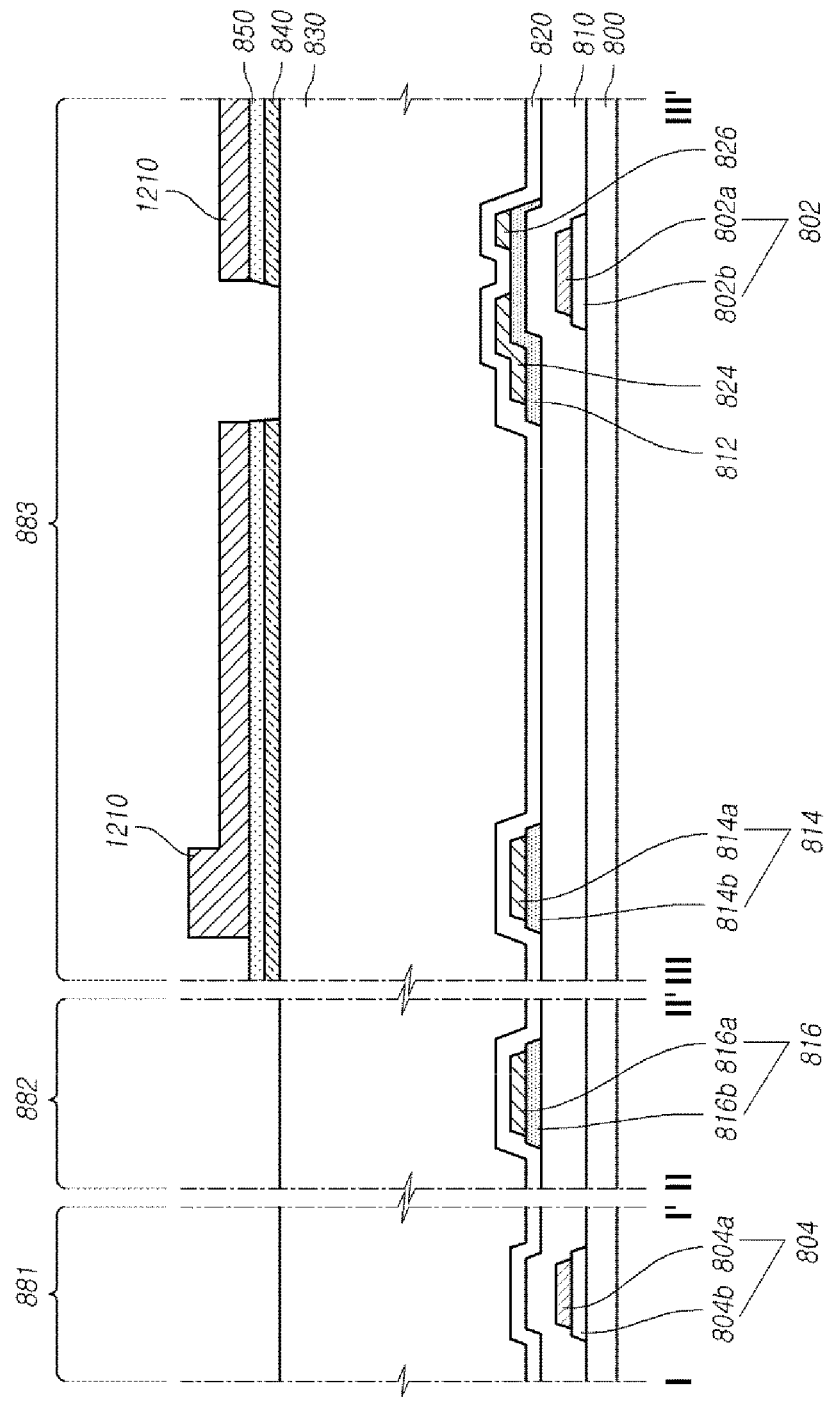

FIG. 12B shows that the conductive metal layer 850 is wet-etched after the photoresist is coated, and the first electrode layer 840 is wet-etched to form the first electrode.

FIG. 12C shows that the photoresist is dry-etched to thereby etch the thin film transistor protective layer 830 and the first protective layer 820. In this process, the first contact hole 891 is formed through which the source electrode 824 is exposed. In the dry-etching of FIG. 12C, the photoresist 1210 of FIG. 12A is ashed and a portion 1210a thereof remains.

Referring to the process of FIGS. 12A to 12C, the thin film transistor protective layer 830 and the first protective layer 820 is dry-etched to create a pattern by using the pattern of the first electrode layer 840 and the conductive metal layer 850 as a mask.

Figure 12D:
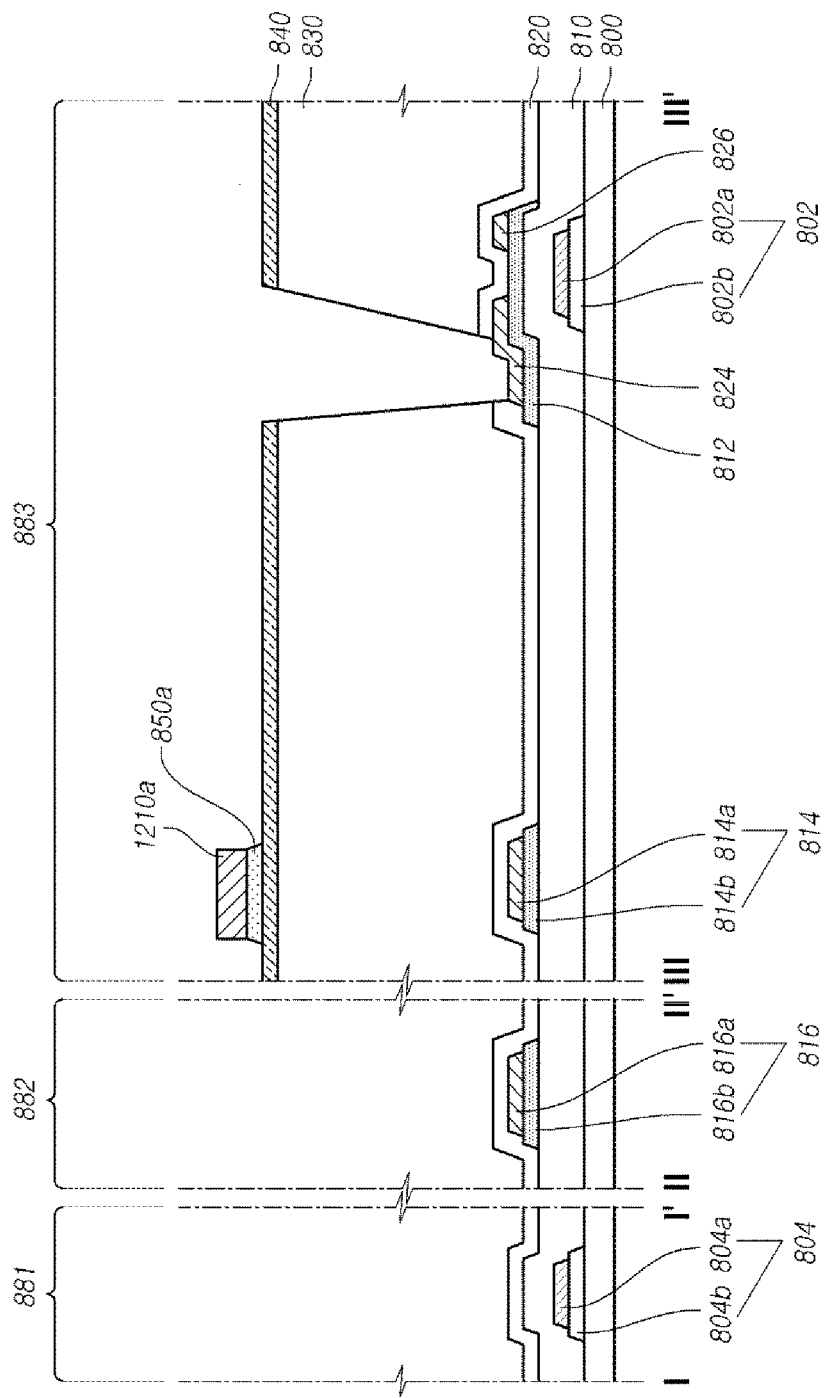

FIG. 12D shows that the conductive metal layer 850 is etched by using the remaining photoresist 1210a to form the touch signal line 850a.

In FIG. 12D, the touch signal line 850a results from the dry-etching process using the photoresist 1210a.

FIG. 12E shows that the photoresist 1210a is removed after the touch signal line 850a of FIG. 12D is formed.

Figure 12F:
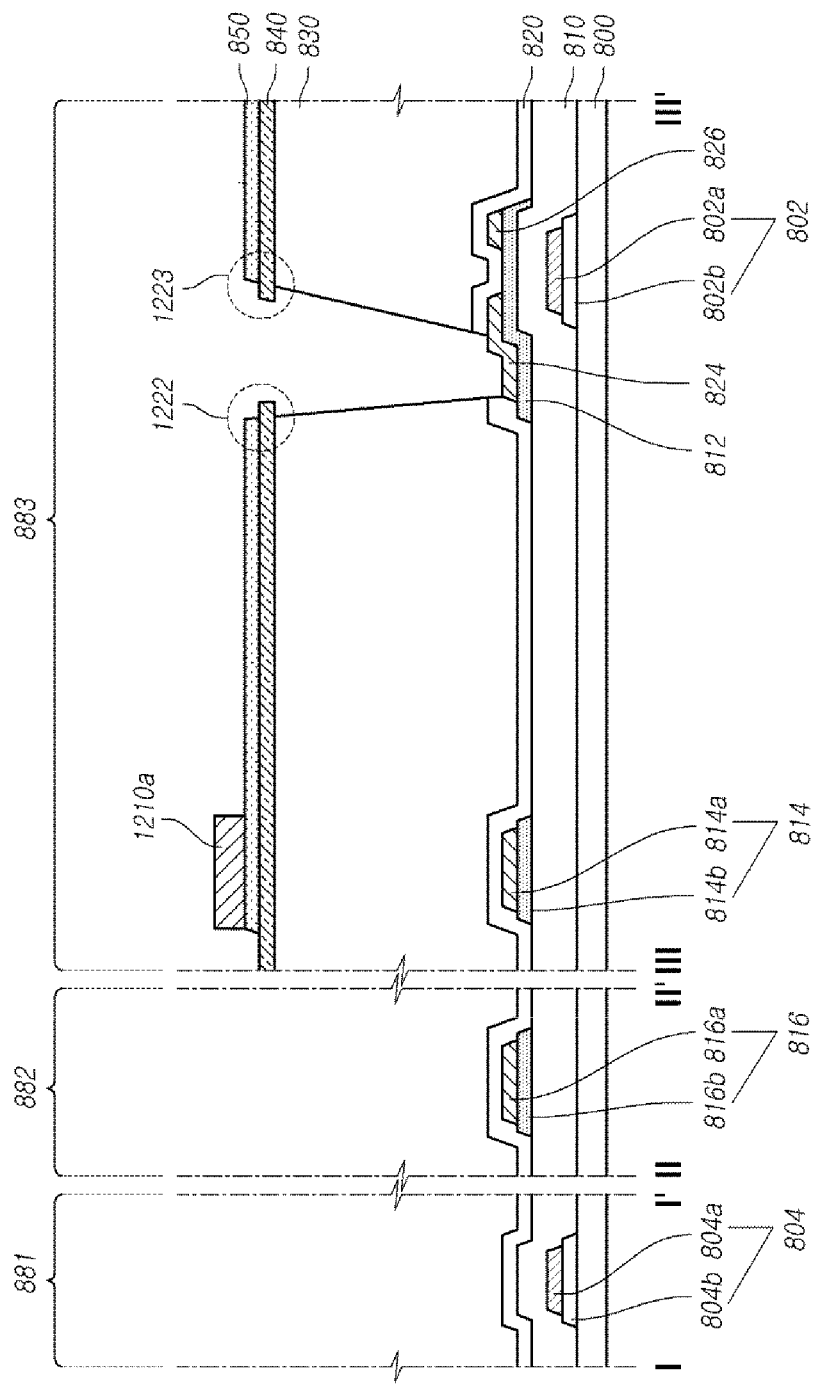

FIG. 12F shows that one end of the first metal layer 840 of FIG. 12C protrudes. Protrusions 1222 and 1223 may result from the process of etching the thin film transistor protective layer 830 because the first metal layer 840 is partially etched. Accordingly, the additional wet-etching process may be performed with respect to the protrusions 1222 and 1223 during the wet-etching of FIG. 12D after the dry-etching of FIG. 12C or before the wet-etching of FIG. 12D.

Next, the process of forming the second protective layer and the first protective layer in the process 790 of FIG. 7 by using a single mask (Mask #2) will be described with reference to FIGS. 13A to 13E.

FIGS. 13A to 13E illustrate a process of forming the first electrode protective layer and the second electrode according to the first embodiment of the present invention.

Figure 13A:
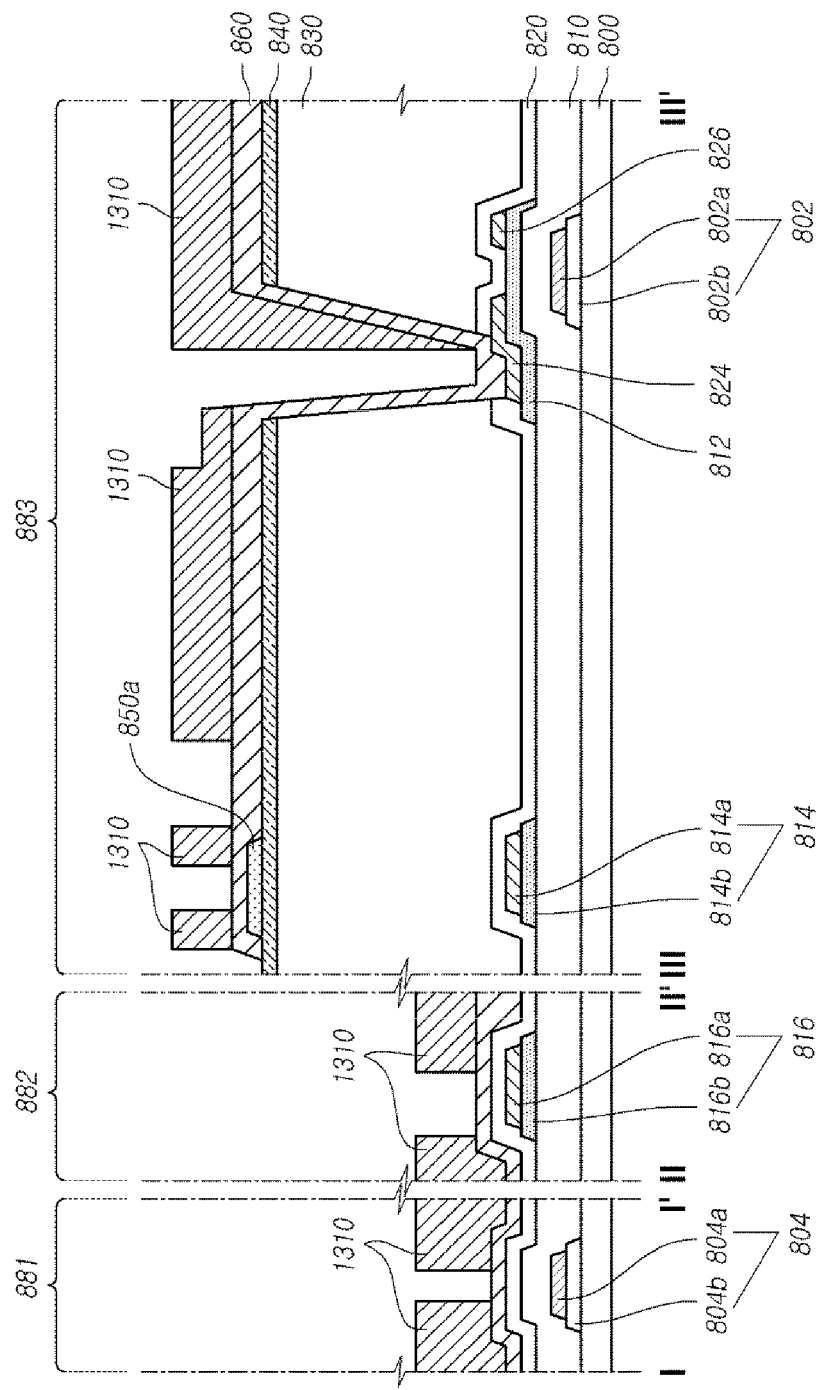
FIGS. 13A to 13E illustrate a process of forming the first electrode protective layer and the second electrode according to the first embodiment of the present invention.

FIG. 13A shows that the first electrode protective layer 860 is formed on the layer of FIG. 12E and photoresist 1310 is coated thereon. An example of the first electrode protective layer 860 may be the second protective layer PAS2, but it is not limited thereto.

Figure 13B:
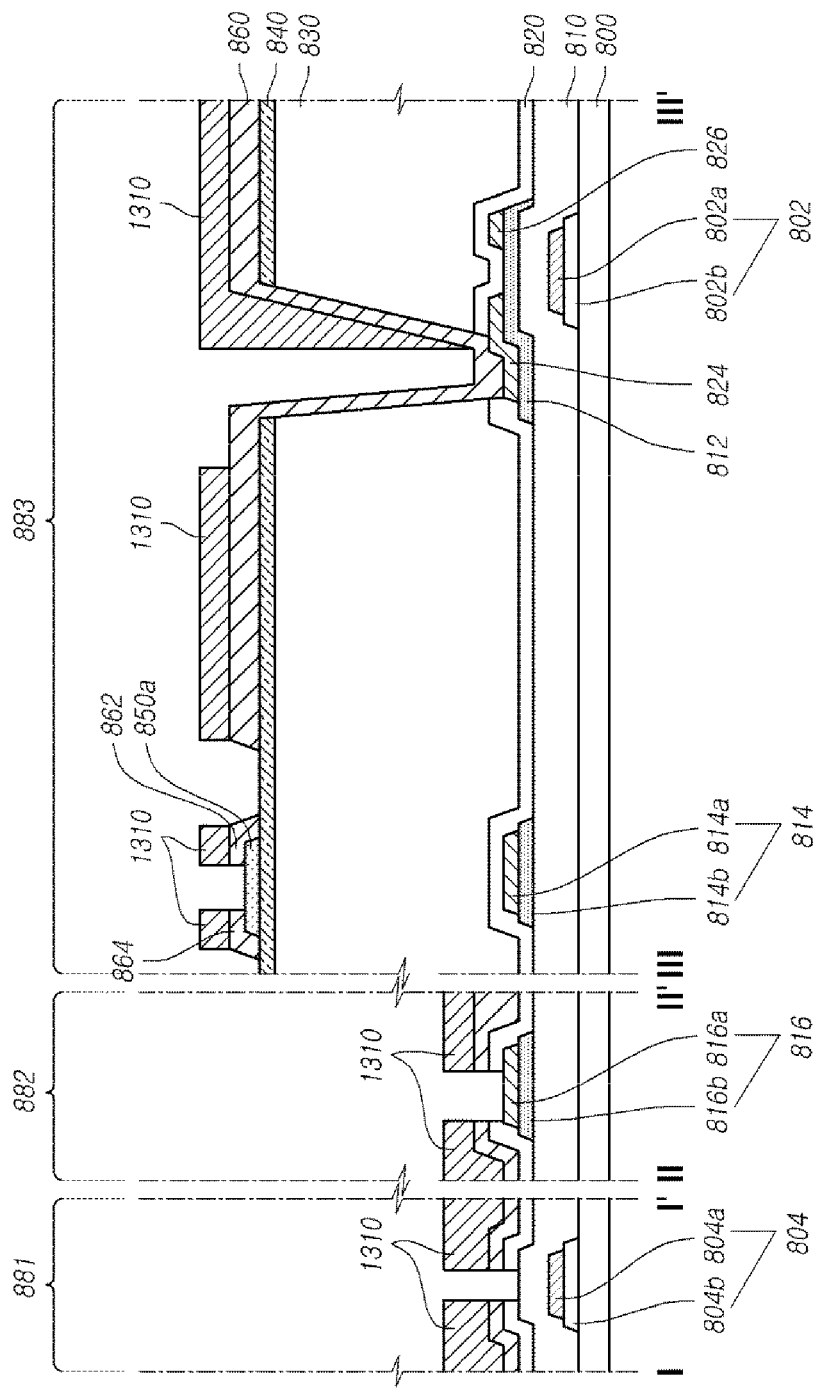

FIG. 13B shows that the first electrode protective layer 860 on the gate pad portion 881 and the data pad portion 882 is partially dry-etched by ashing the photoresist. Layers 862 and 864 are formed at both sides of the touch signal line 850a in the first electrode protective layer.

Figure 13C:
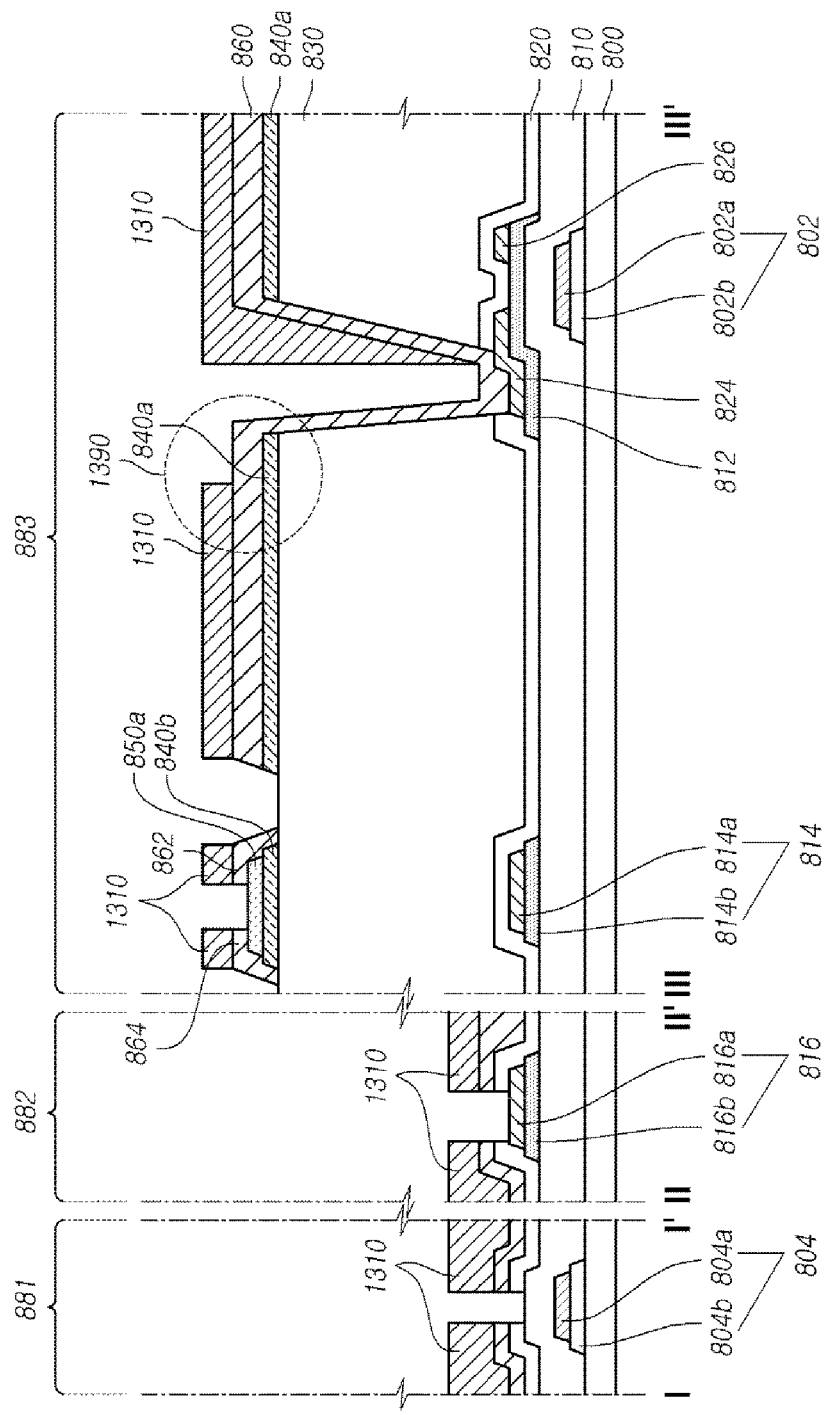

FIG. 13C shows that the first electrode 840a and the first touch connection pattern 840b are formed by additionally wet-etching the first electrode layer 840.

Figure 13D:
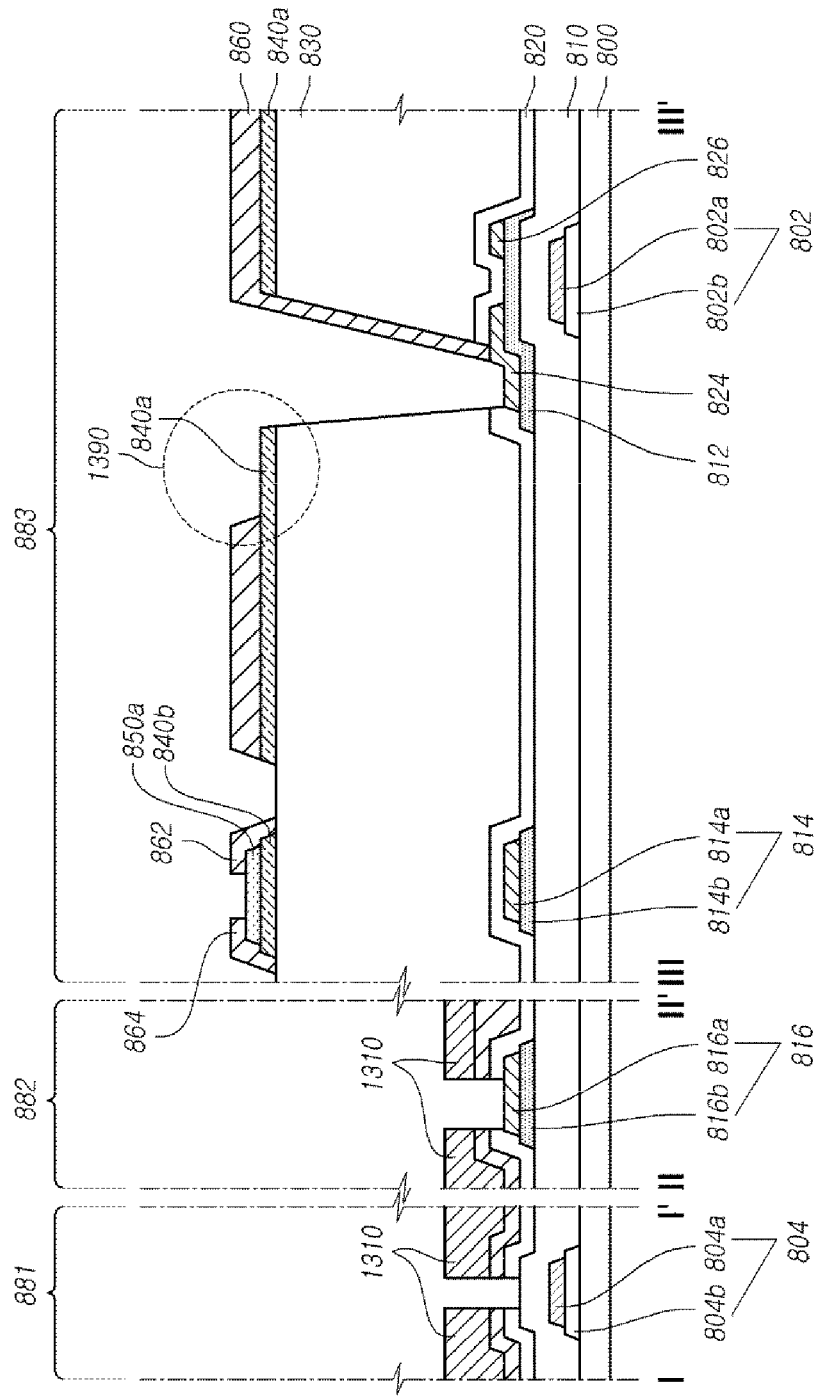
Figure 13E:
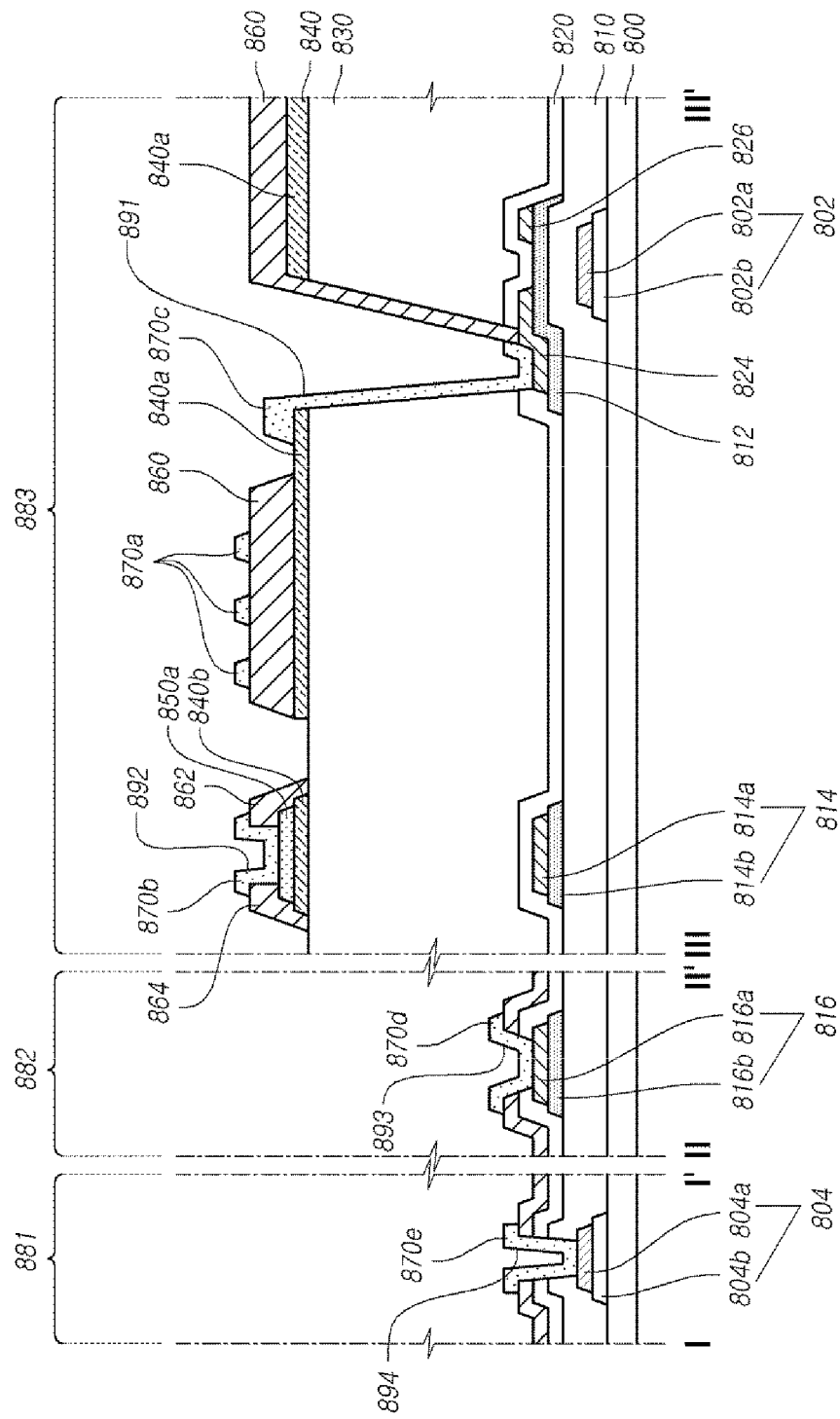

FIG. 13D illustrates that the third contact hole 893 and the fourth contact hole 894 are formed by dry-etching the layers of FIG. 13C so that the gate line 804a for the gate pad portion 891 is exposed through the fourth contact hole 894 and the data line 816a for the data pad portion 882 is exposed through the third contact hole 893.

FIG. 13D shows the process of forming the common electrode (the example of the second electrode) in the process 790 of FIG. 7 by using a single mask (Mask #3). As a result, as show in FIG. 8A and FIG. 13E, the second electrode 870a, the first connection pattern 870c, the second touch connection pattern 870b through the second contact hole 892, the data pad connection portion 870d and the gate pad connection portion 870e are formed.

The first connection pattern 870c, which is made of the same material and by the process as those of the second electrode, contacts the first electrode 840a with the source electrode 824 at the sides thereof.

Five masks may be used in the process from FIG. 11 to FIG. 13E in total. Particularly, since three masks are used in the process of forming the first electrode, the second electrode and the touch signal line after forming the thin film transistor, the process may be simplified.

In the dry-etching process of FIG. 13C, the first electrode 840a is exposed in the area 1390. The first electrode 840a may be heat-treated by selectively conducting an annealing process in order to maintain the same. That is, the first electrode layer is formed by the amorphous deposition process, and the first electrode is formed by wet-etching. Then, the first electrode is heat-treated for polymerization in order not to be etched in the later process. Accordingly, the first electrode may be prevented from being etched by accident in other processes.

Now, the process of forming the layers of FIG. 8B according to the second embodiment of the present invention will be described in detail. The beginning of the process is shown in FIG. 11 and followed by the process shown in FIGS. 14A to 15E.

The process of forming the first electrode (pixel electrode), the touch signal line and the thin film transistor protective layer (planarization layer or overcoat layer) in the process 790 of FIG. 7 by using a single mask (Mask #1) will be described with reference to FIGS. 14A to 14F.

The first metal layer 840 and the conductive metal layer 850 are formed first as shown in FIG. 11, and followed by the later procedures.

FIGS. 14A to 14F illustrate a process of forming the first electrode, a touch signal line, a thin film transistor protective layer according to the second embodiment of the present invention.

Figure 14A:
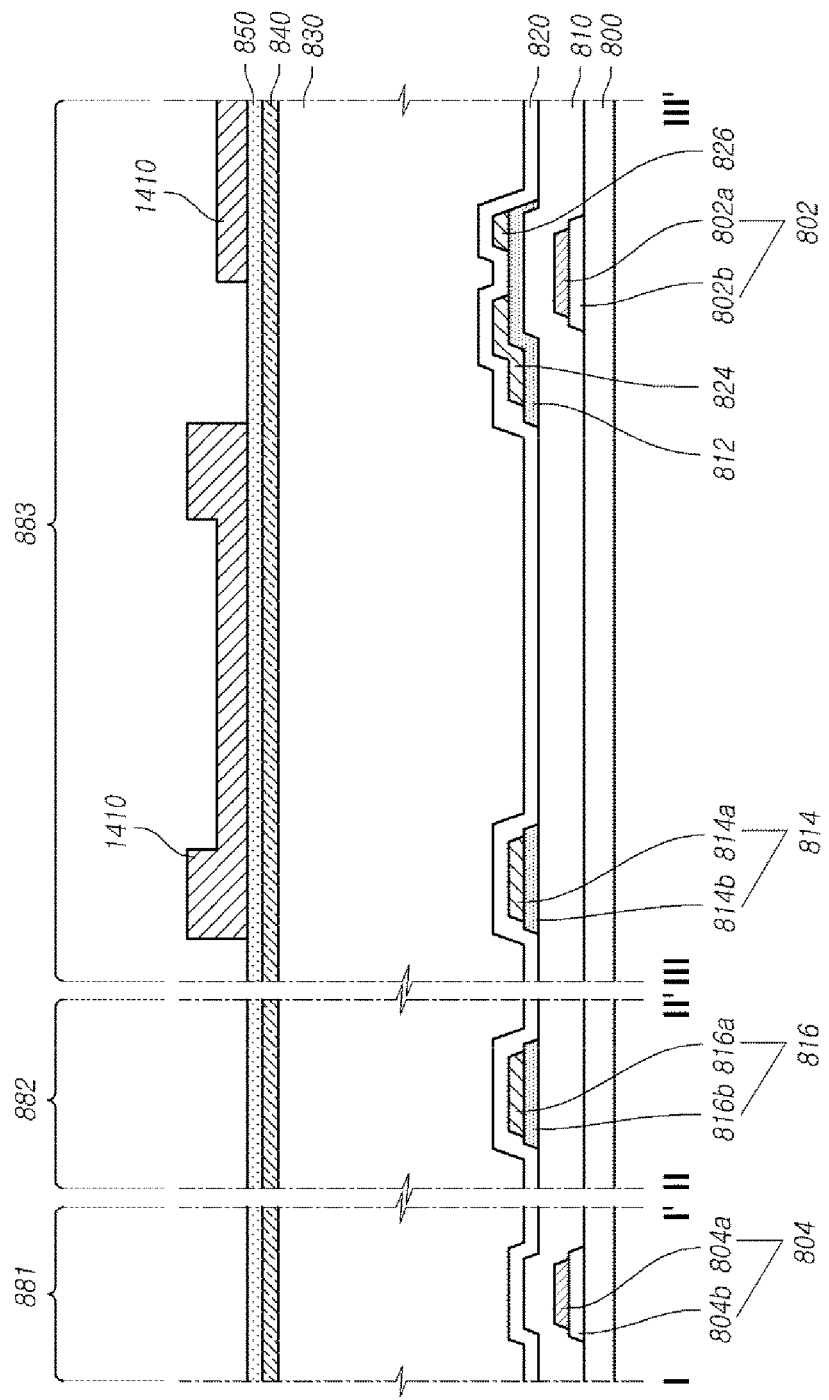

FIG. 14A shows that the photoresist 1410 is coated on the conductive metal layer 850 formed in FIG. 11. The embodiment of FIG. 14A is different from the first embodiment in that the second connection pattern 850b is formed, so the photoresist 1410 thereof is different from the photoresist 1210 of FIG. 12a.

Figure 14B:
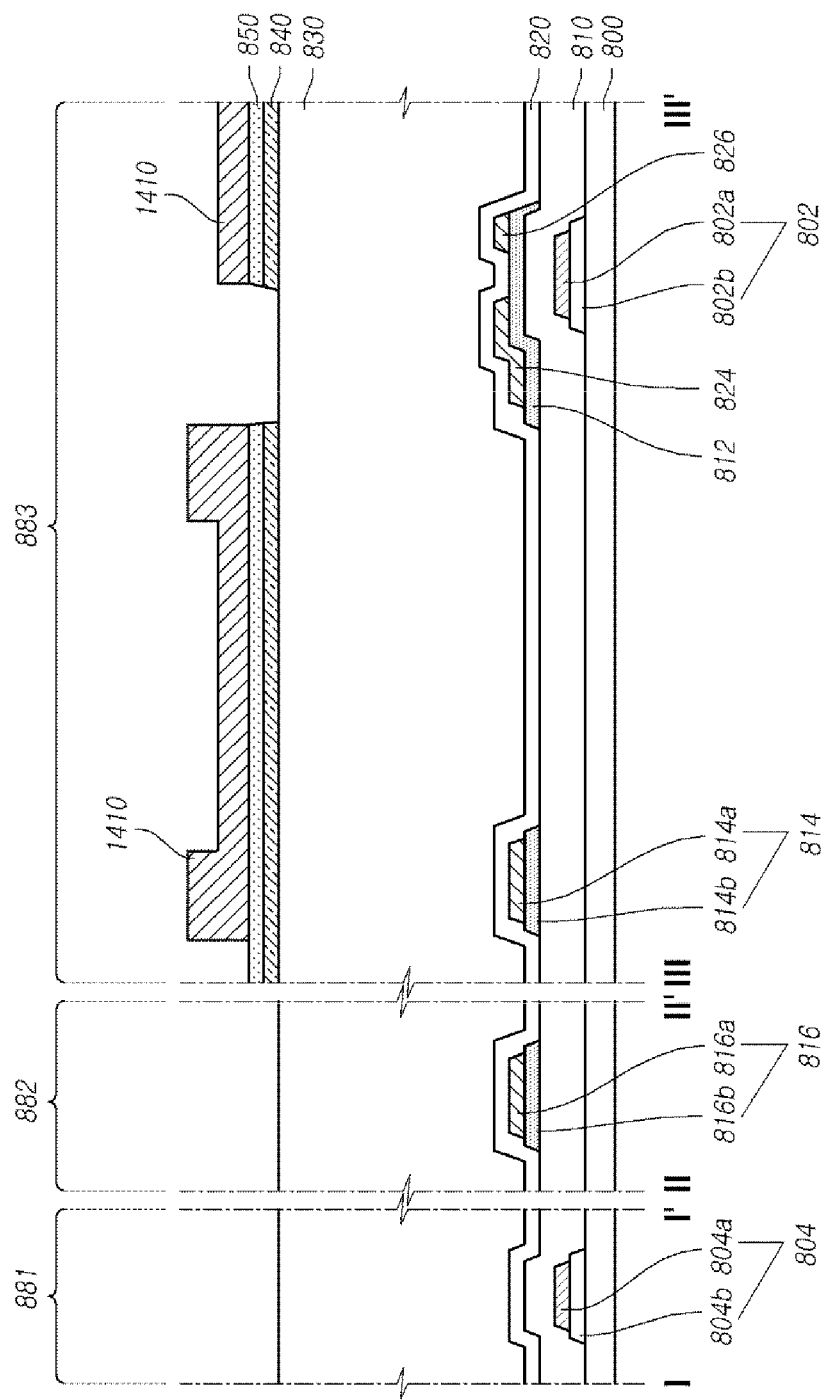

FIG. 14B shows that the conductive metal layer 850 is wet-etched after the photoresist is coated, and the first electrode layer 840 is wet-etched to form the first electrode.

Figure 14C:
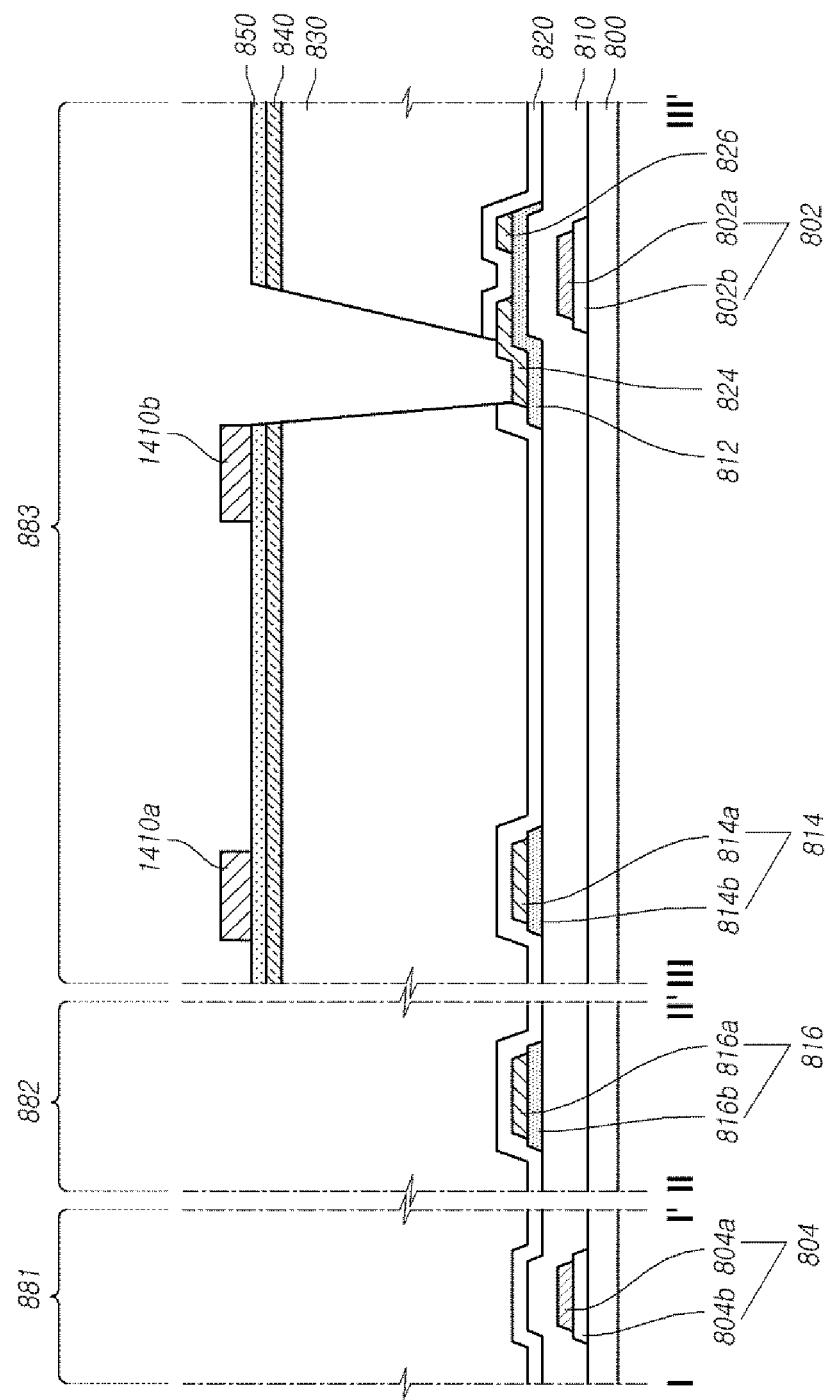

FIG. 14C shows that the photoresist is dry-etched so that the thin film transistor protective layer 830 and the first protective layer 820 are etched. In the process, the first contact hole 891 is formed, through which the source electrode 824 is exposed. In the dry-etching of FIG. 14C, the photoresist 1410 of FIG. 14A is ashed and a portion 1410a and 1410b thereof remains.

Referring to the process of FIGS. 14A to 14C, the thin film transistor protective layer 830 and the first protective layer 820 is dry-etched to create a pattern by using the pattern of the first electrode layer 840 and the conductive metal layer 850 as a mask.

FIG. 14D shows that the conductive metal layer 850 is etched by using the remaining photoresist 1410a and 1420b to form the touch signal line 850a and the second connection pattern 850b.

In FIG. 14D, the touch signal line 850a and the second connection pattern 850b result from the wet-etching process using the photoresist 1410a and 1410b.

Figure 14E:
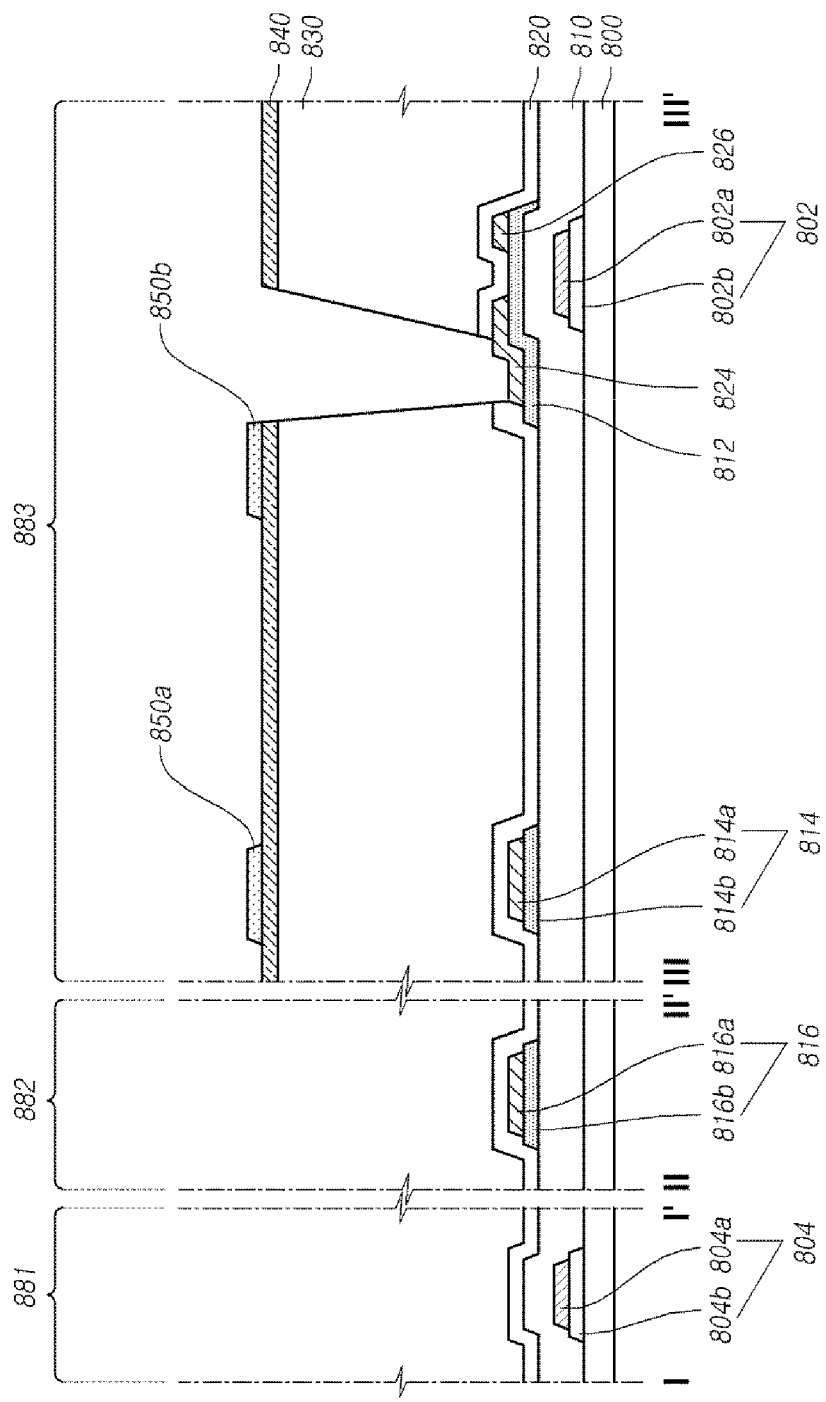

FIG. 14E shows that the photoresist 1410a and 1410b is removed after the touch signal line 850a and the second connection pattern 850b of FIG. 14D are formed.

Figure 14F:
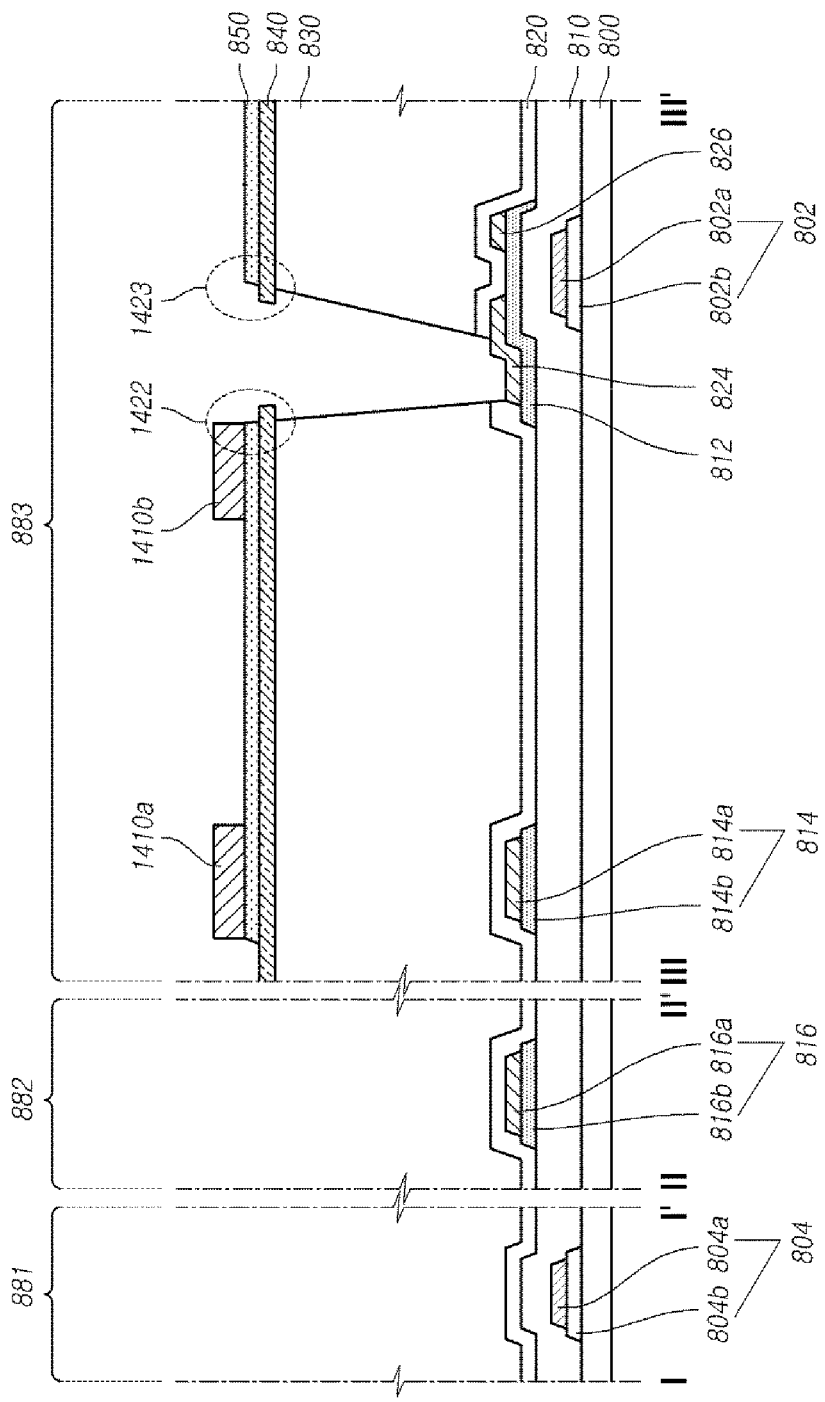

FIG. 14F shows that one end of the first metal layer 840 of FIG. 14C protrudes. Protrusions 1422 and 1423 may result from the process of etching the thin film transistor protective layer 830 because the first metal layer 840 is partially etched. Accordingly, the additional wet-etching process may be performed with respect to the protrusions 1422 and 1423 during the wet-etching of FIG. 14D after the dry-etching of FIG. 14C or before the wet-etching of FIG. 14D.

Next, the process of forming the second protective layer, the first protective layer and the second electrode in the process 790 of FIG. 7 by using a single mask (Mask #2) will be described with reference to FIGS. 15A to 15E.

FIGS. 15A to 15E illustrate a process of forming the first electrode protective layer and the second electrode according to the second embodiment of the present invention.

Figure 15A:
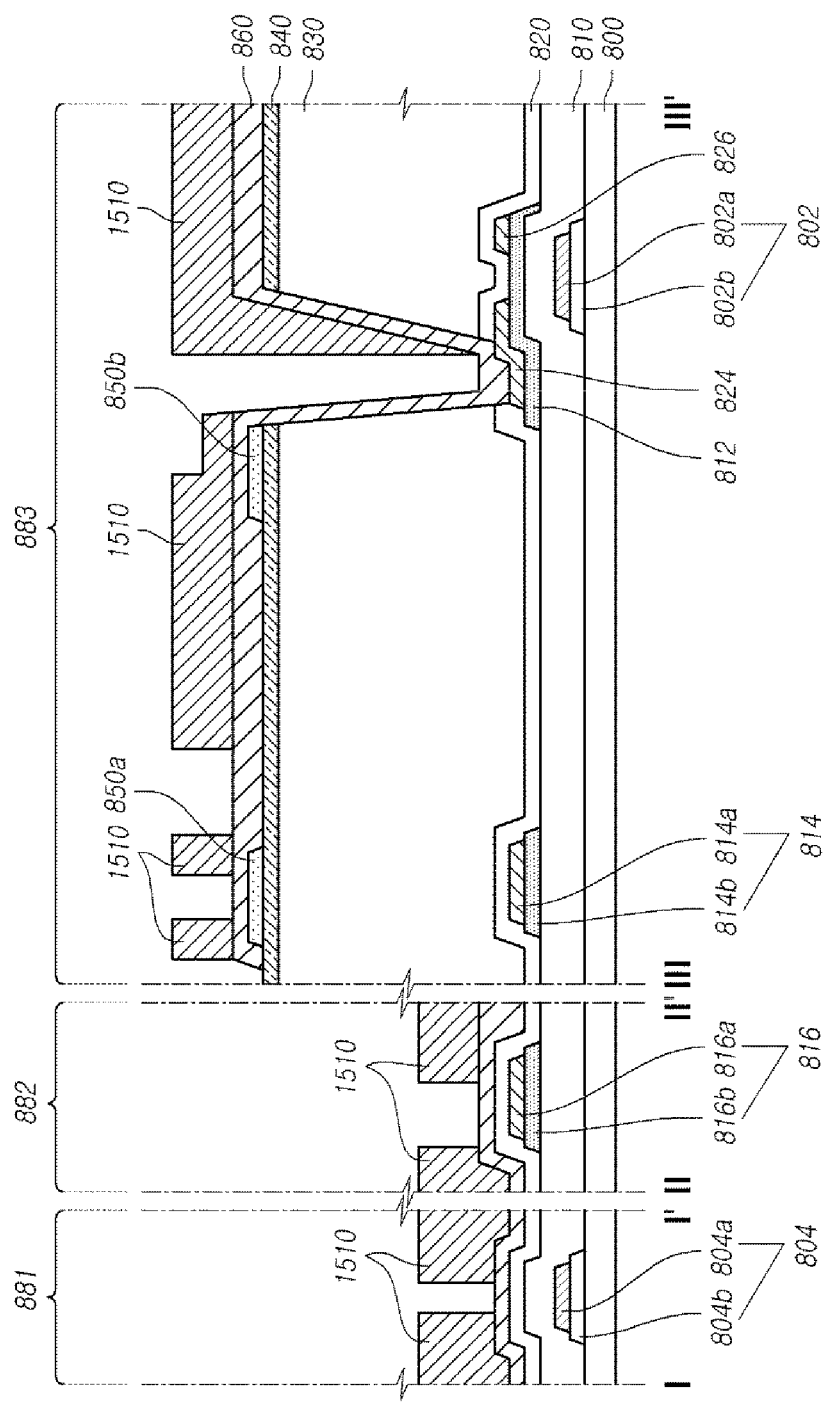
FIGS. 15A to 15E illustrate a process of forming the first electrode protective layer and the second electrode according to the second embodiment of the present invention.

FIG. 15A shows that the first electrode protective layer 860 is formed on the layers of FIG. 14E and the photoresist 1510 is coated thereon. An example of the first electrode protective layer 860 may be the second protective layer PAS2, but it is not limited thereto.

Figure 15B:
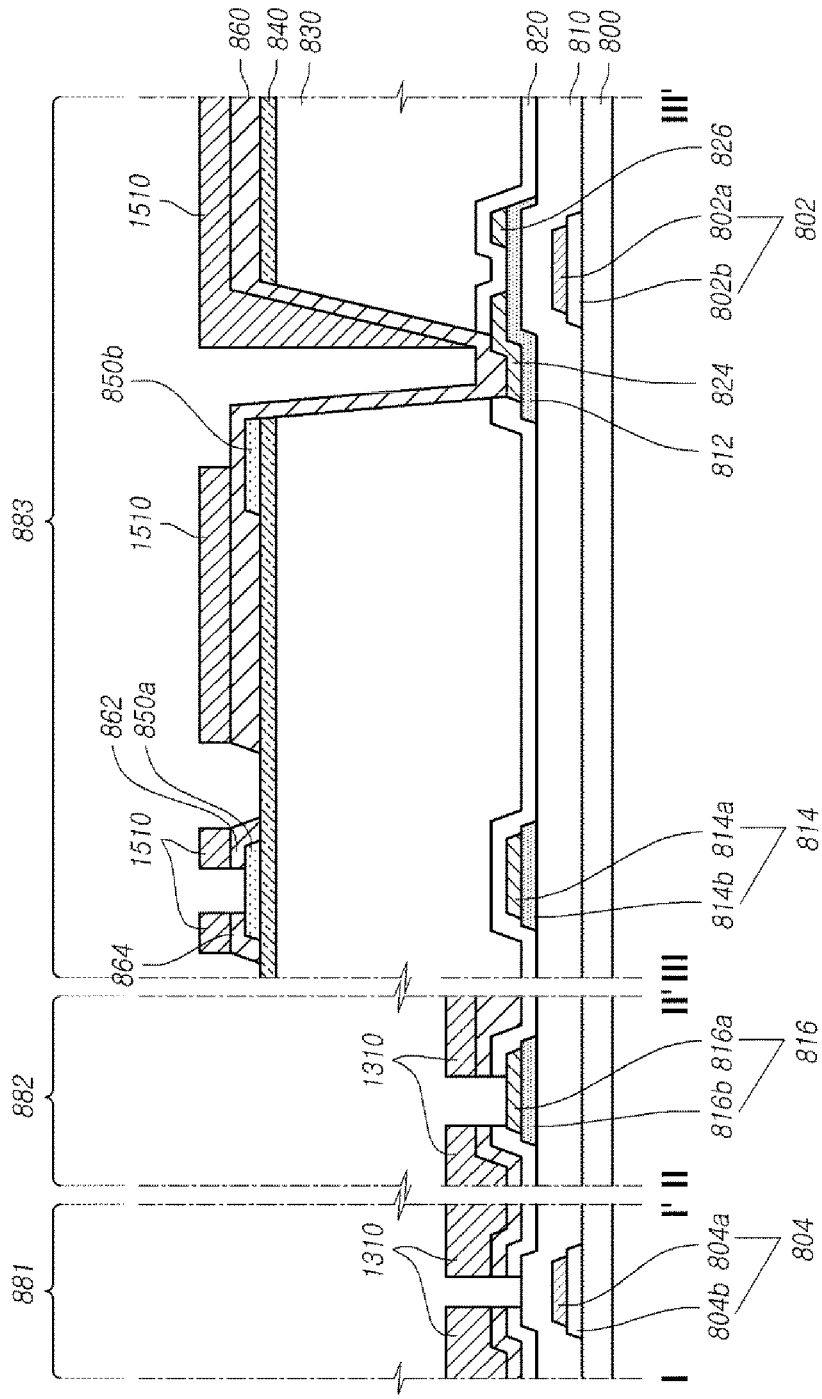

FIG. 15B shows that the first electrode protective layer on the gate pad portion 881 and the data pad portion 882 is partially etched by ashing the photoresist 1510. Layers 862 and 864 are formed at both sides of the touch signal line 850a in the first electrode protective layer.

Figure 15C:
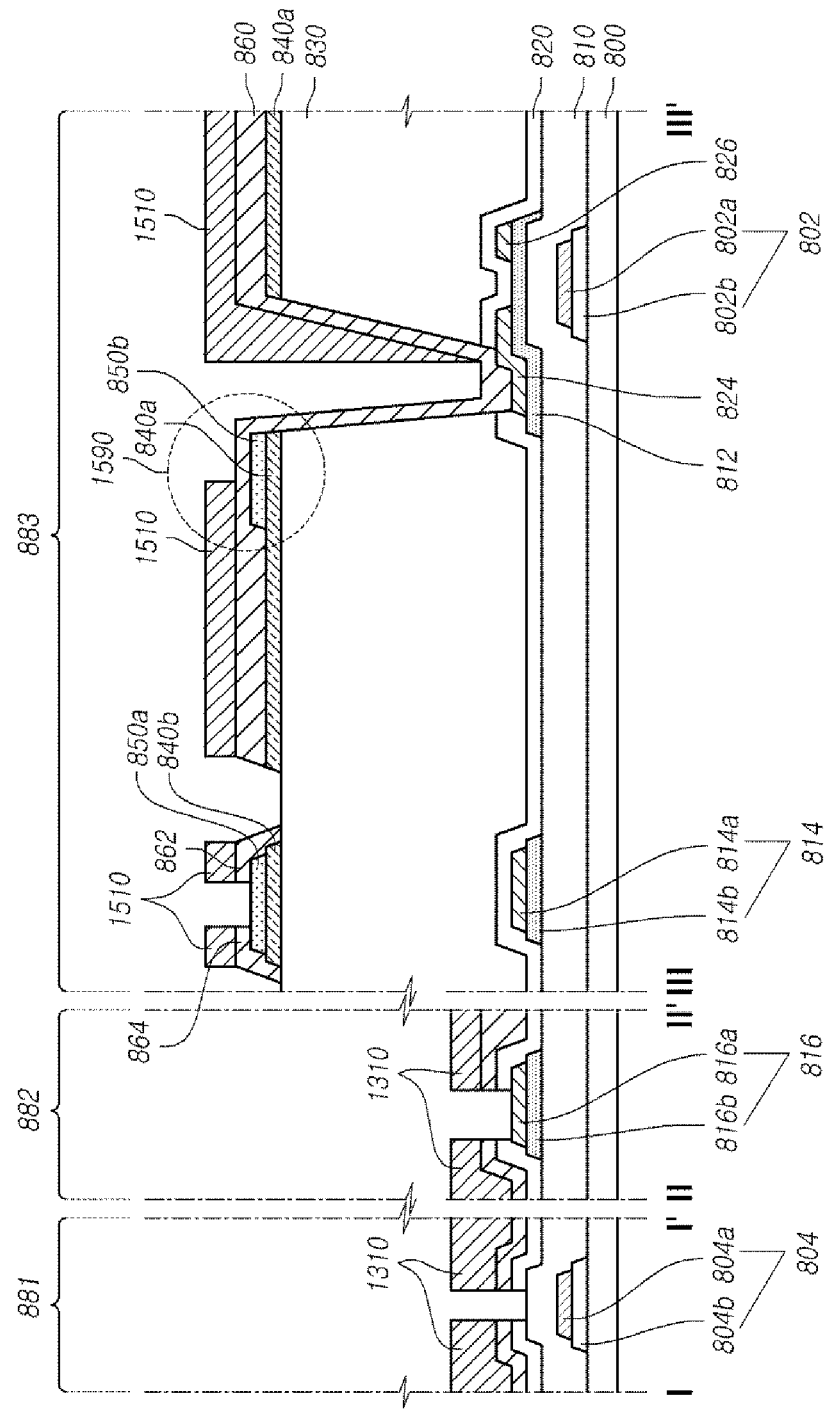

FIG. 15C shows that the first electrode 840a and the first touch connection pattern 840b are formed by additionally wet-etching the first electrode layer.

Figure 15D:
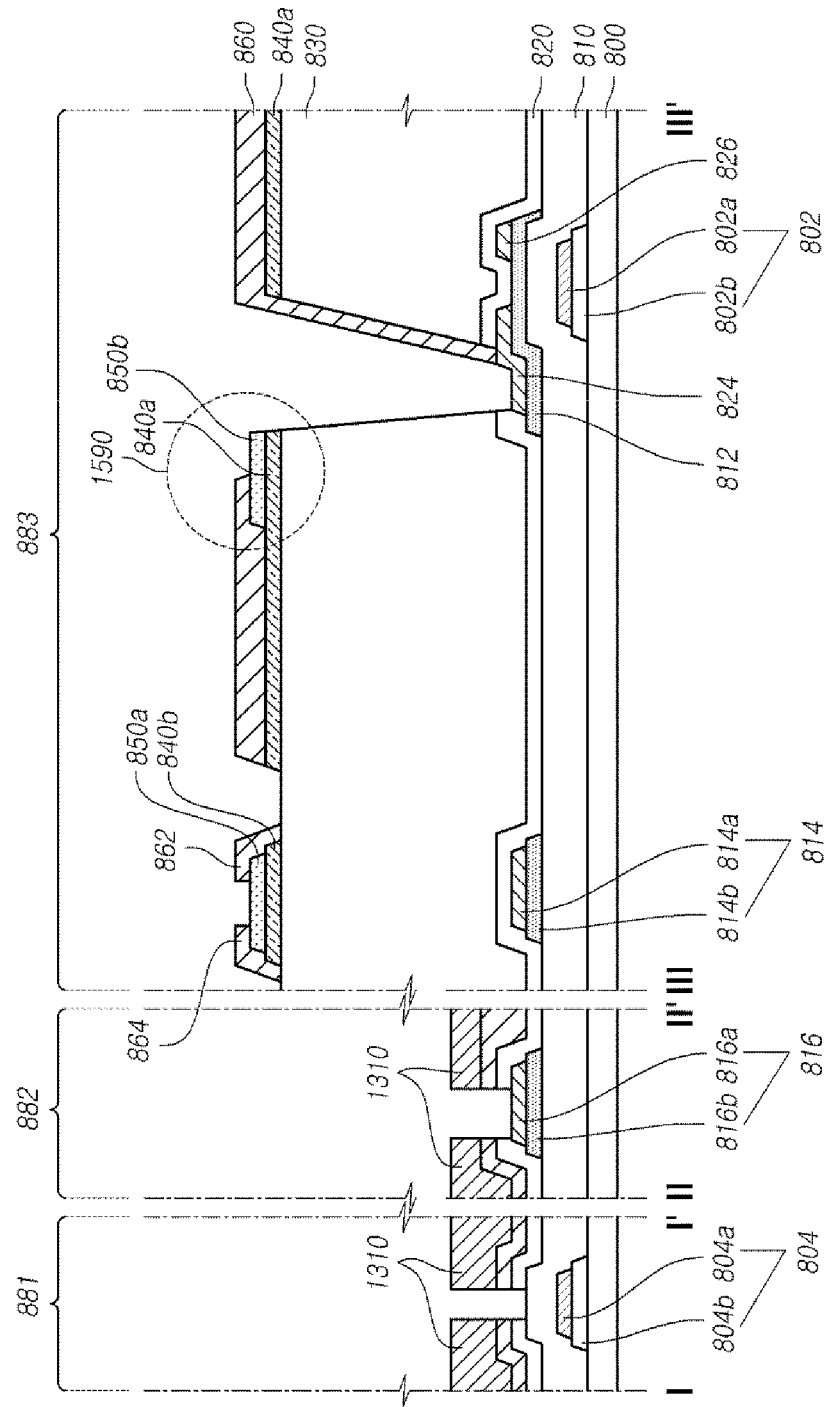
Figure 15E:
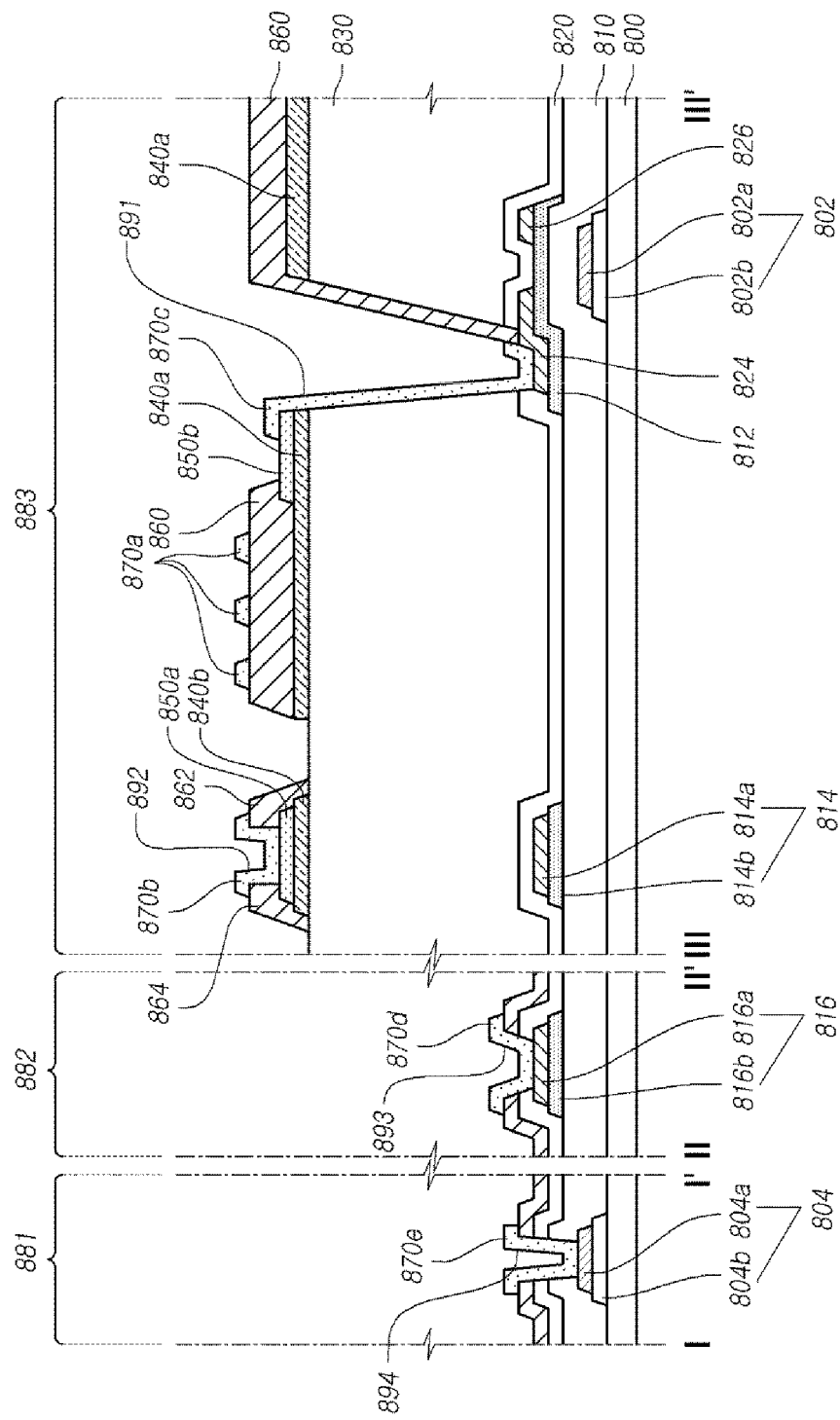

FIG. 15D illustrates that the third contact hole 893 and the fourth contact hole 894 are formed by dry-etching the layers of FIG. 15C so that the gate line 804a for the gate pad portion 891 is exposed through the fourth contact hole 894 and the data line 816a for the data pad portion 882 is exposed through the third contact hole 893.

FIG. 15D shows the process of forming the common electrode (the example of the second electrode) in the process 790 of FIG. 7 by using a single mask (Mask #3). As a result, as show in FIG. 8B and FIG. 15E, the second electrode 870a, the first connection pattern 870c, the second touch connection pattern 870b through the second contact hole 892, the data pad connection portion 870d and the gate pad connection portion 870e are formed.

Differently from FIG. 8A, the first connection pattern 870c, which is made of the same material and by the same process as those of the second electrode, contacts the second connection pattern 850b on the first electrode 840a with the source electrode 824 at the sides thereof.

In the dry-etching process of FIG. 15C, the first electrode 840a is exposed in the area 1590, and the second connection pattern 850b is formed on the first electrode 840a in order to maintain the same. Accordingly, the first electrode may be prevented from being etched by accident in other processes.

In order to prevent the second connection pattern 850b of the second embodiment from being dry-etched, the conductive metal layer may be made of Mo/Al/Mo, but the present invention is not limited thereto.

As described in the first and second embodiments, in forming the first electrode, the touch signal line and the second electrode, the number of masks can be reduced to thereby improve productivity and save cost. Although the Vcom-on-top (VOT) structure, by which the second electrode is formed after the first electrode, is described in the present specification, the formation sequence and locations of the first electrode and the second electrode may be changeable, and the present invention may be applied to the pixel-on-top (POT) structure by which the first electrode is formed after the second electrode. The first and second embodiments of the present invention may be applied to the Vcom-on-top, i.e., common electrode-on-top, structure to which the thin film transistor protective layer, for example, the planarization layer PAC or the overcoat (OC) layer are applied. Alternatively, the first and second embodiments of the present invention may be applied to the pixel-on-top structure. In addition, the first connection pattern is formed through a side contact when forming the common electrode (the second electrode) in the pixel-source-drain (PXL-SD) contact.

In the side contact of the second connection pattern by using a common electrode material (Vcom metal) in pixel-source-drain (PXL-S/D) contact hole portion, the conductive metal layer (the third metal layer or M3) constituting the touch signal line may be accumulated on the pixel electrode.

In the present invention, the thin film transistor protective layer (PAC or OC), the second electrode Vcom and the touch signal line (conductive metal layer, M3) are formed en bloc, so the number of masks may be reduced. Further, in the second connection pattern for connecting the touch signal line with the first electrode Vcom, the width of the touch signal line is narrower than the first touch connection pattern, and the first electrode protective layer is positioned at the edge of the width of the touch signal line. Furthermore, the second contact hole is positioned at the first electrode protective layer to expose the touch signal line and the second touch connection pattern is connected through the second contact hole. There is a feature of the process by which the first electrode is wet-etched after the first electrode protective layer is dry-etched. In this case, the first electrode protective layer is not provided at the area where the second touch connection pattern is formed, and the pattern of the first electrode is retracted inward during the wet-etching process for the thin film transistor protective layer.

In the application of the first and second embodiments of present invention, the thin film transistor protective layer (PAC or OC) and the first protective layer (PAS0) may be dry-etched to be a pattern by using the pattern (Vcom ITO PTN) of the second electrode as a mask. Further, it is not easy to selectively etch the organic material in the dry-etching of the organic material, so the organic material may be partially etched or the lower first protective layer (PAS0) may be partially etched as well. In addition, the thin film transistor protective layer may be replaced with other organic materials having low permittivity and may be applied with a photosensitive material or a non-photosensitive material.

The mask-reduction process of the present invention may be applied to substrates including a-Si, Oxides and LTPS, which will be described with reference to FIGS. 18 and 19.

The embodiments of the present invention include the conductive metal layer (M3L) as set forth above.

Figure 16:
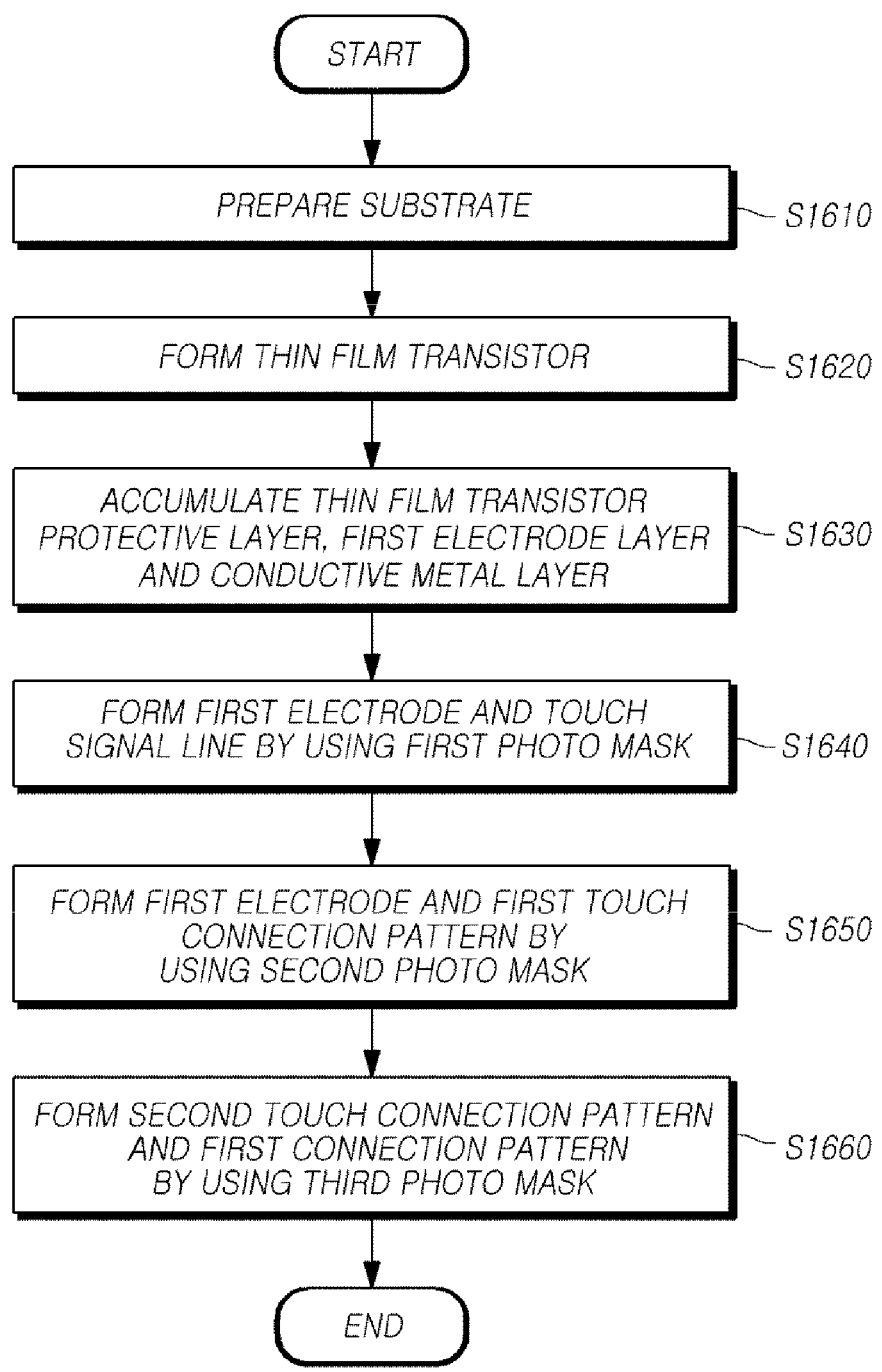
FIGS. 16 and 17 are flowcharts illustrating a process of forming signal lines of a display device in which a touch sensor is built according to an embodiment of the present invention.
Figure 17:
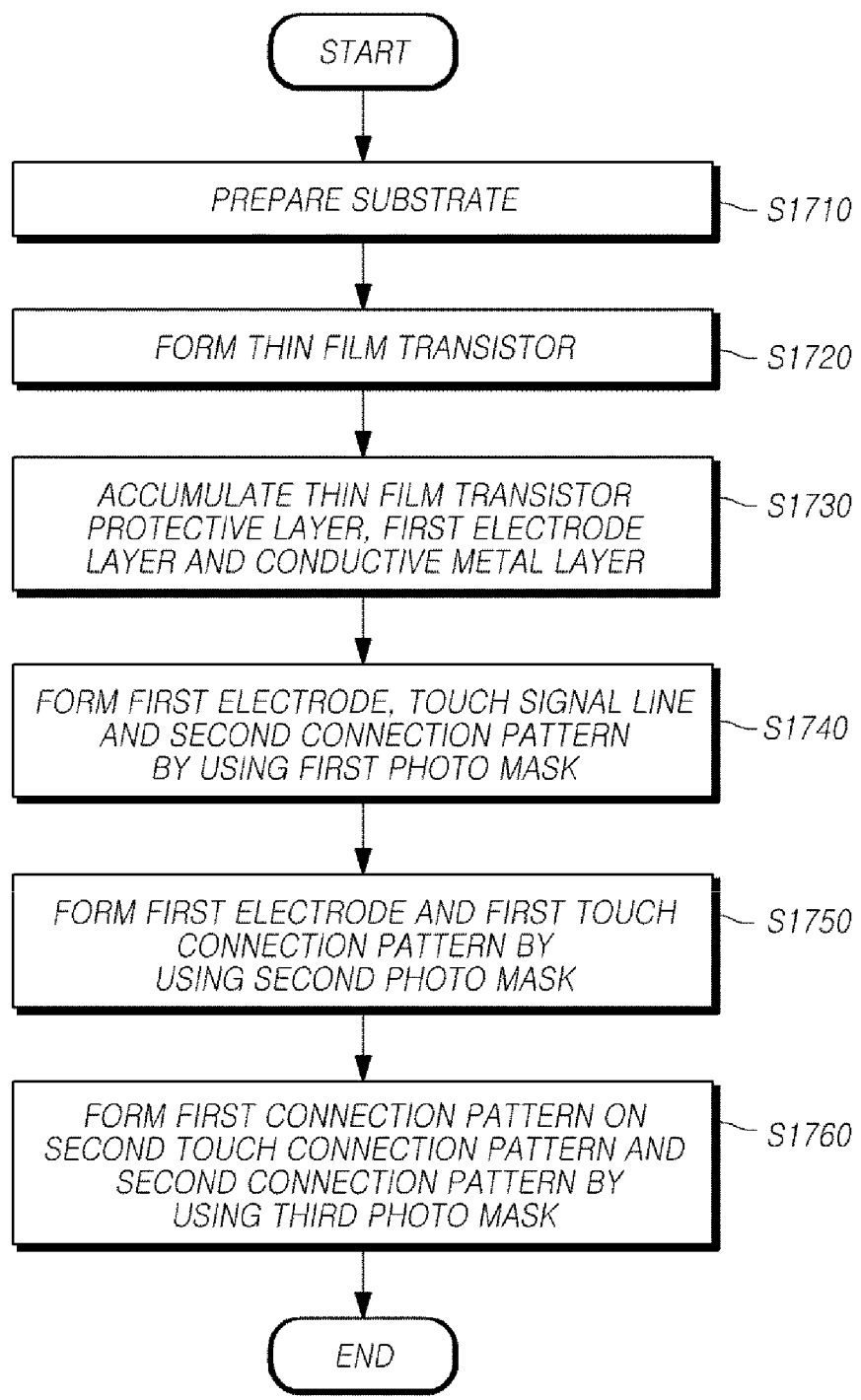

FIGS. 16 and 17 are flowcharts illustrating a process of forming signal lines of a display device in which a touch sensor is built according to an embodiment of the present invention.

FIG. 16 shows the process according to the first embodiment of the present invention.

The substrate is prepared (S1610), and the thin film transistor is formed on the substrate (S1620). Then, the thin film transistor protective layer covering the thin film transistor, the first electrode layer and the conductive metal layer are accumulated thereon (S1630). Operations S1620 and S1630 have been described in FIG. 11.

Afterwards, as set forth in FIGS. 12A to 12E, the first electrode layer, the conductive metal layer and the thin film transistor protective layer are etched by using the first photo-mask to form the first contact hole, through which the source electrode or the drain electrode is exposed, on the first electrode layer and the thin film transistor protective layer, and the first electrode and the touch signal line are formed (S1640).

Next, the photoresist is coated by using the second photo-mask after the first electrode protective layer is coated, and the first electrode and the first touch connection pattern separated from the first electrode are formed (S1650). This process has been described in FIGS. 13A to 13D. After that, the second electrode and the second touch connection pattern, which is made of the same material as that of the second electrode to be connected with the second electrode, are formed by using the third photo-mask, and at the same time, the first connection pattern, which connects one of the exposed source electrode or the drain electrode with the first electrode through the first contact hole, is formed (S1660). This process has been described above in FIG. 13E.

FIG. 17 shows the process according to the second embodiment of the present invention.

The substrate is prepared (S1710), and the thin film transistor is formed on the substrate (S1720). Then, the thin film transistor protective layer covering the thin film transistor, the first electrode layer and the conductive metal layer are accumulated thereon (S1730). Operations S1720 and S1730 have been described before in FIG. 11.

Afterwards, as set forth in FIGS. 14A to 14E, the first electrode layer, the conductive metal layer and the thin film transistor protective layer are etched by using the first photo-mask to form the first contact hole, through which the source electrode or the drain electrode is exposed, on the first electrode layer and the thin film transistor protective layer, and the first electrode, the touch signal line and the second connection pattern are formed (S1740).

Next, the photoresist is coated by using the second photo-mask after the first electrode protective layer is coated, and the first electrode and the first touch connection pattern separated from the first electrode are formed (S1750). This process has been described in FIGS. 15A to 15D. After that, the second electrode and the second touch connection pattern, which is made of the same material as that of the second electrode to be connected with the second electrode, are formed by using the third photo-mask, and at the same time, the first connection pattern, which indirectly connects one of the exposed source electrode or the drain electrode with the first electrode through the first contact hole, is formed (S1760). This process has been described before in FIG. 15E. Indirect connection means that the first connection pattern indirectly connects the first electrode with one of the source electrode and the drain electrode because the second connection pattern is formed on the first electrode and the first connection pattern is formed on the second connection pattern.

The data pad connection portion and the gate pad connection portion are formed of the same material and by the same process as those of the second electrode in FIGS. 16 and 17. That is, as described in FIGS. 13E and 15E, the data pad connection portion and the gate pad connection portion are formed at the same time as the formation of the second electrode and the first connection pattern.

Although the process and configuration have been described with respect to the thin film transistor of which the activation layer is amorphous silicon in the embodiment, the connection pattern between the pixel electrode and the source/drain electrode of the present invention may be implemented in the case of a metal oxide semiconductor and poly silicon, such as LTPS. The partial operation 625 of FIG. 7, in which the activation layer of the thin film transistor is a metal semiconductor, may be applied to process 790 of the present embodiment. Likewise, the partial operation 635 of FIG. 7 in the case of the LTPS process may be applied to process 790.

Figure 18:
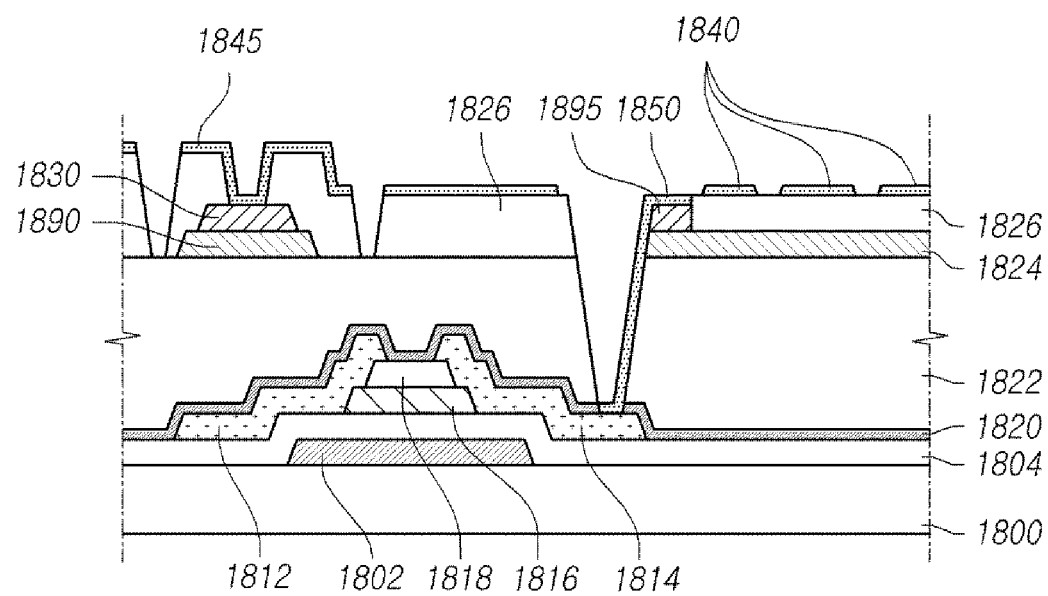
FIG. 18 illustrates an embodiment of the present invention in a case where an activation layer of a thin film transistor is a metal oxide semiconductor.

FIG. 18 illustrates an embodiment of the present invention in a case where an activation layer of a thin film transistor is a metal oxide semiconductor.

FIG. 18 shows the connection pattern between the pixel electrode and the source/drain electrode when applying process 790 of FIG. 7.

A substrate 1800, a gate 1802, a gate insulator 1804, a source electrode 1812, a drain electrode 1814, an activation layer 1816, an etching stopper layer 1818, the first protective layer 1820, a thin film transistor protective layer 1822, a pixel electrode 1824 as an example of the first electrode, the first electrode protective layer 1826, the first touch connection pattern 1890 made of the same material as the first electrode, a touch signal line 1830 under the second connection pattern 1845 made of the same material as the second electrode, and a common electrode 1840 as the second electrode are formed. Further, the first connection pattern 1850 for connecting the pixel electrode 1824 and the drain electrode 1814 as the first electrode. The first connection pattern 1850 is formed of the same material as that of the second electrode 1840 and the second touch connection pattern 1845. In addition, the second connection pattern 1895 may be selectively formed under the first connection pattern 1850, and the second connection pattern 1895 may be made of the same material as that of the touch signal line 1830.

Figure 19:
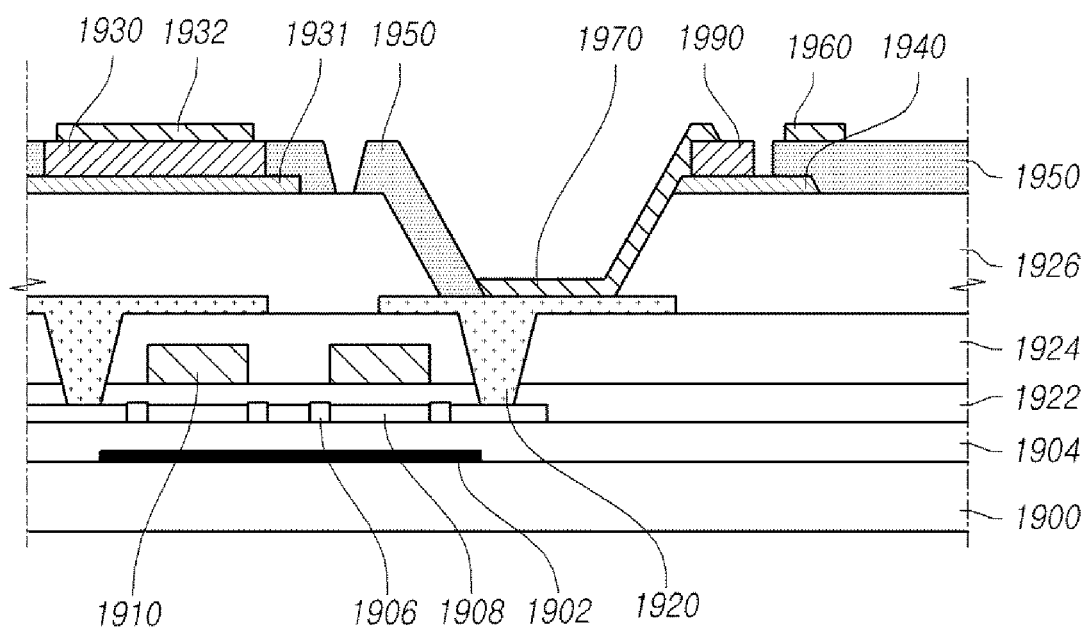
FIG. 19 illustrates an embodiment of the present invention in a case where an activation layer of a thin film transistor is low temperature poly silicon.

FIG. 19 illustrates an embodiment of the present invention in a case where an activation layer of a thin film transistor is low temperature poly silicon.

FIG. 19 shows the connection pattern between the pixel electrode and the source/drain electrode when applying the same operation as the process 790 of FIG. 7.

In the case of the activation layer of LTPS, a substrate 1900, a light-shielding layer 1902, a buffer layer 1904, a lightly doped drain (LDD) 1906, an activation layer 1908, a gate electrode 1910, a data (source/drain) electrode 1920, a gate insulator 1922, a between-layer-insulator 1924, a thin film transistor protective layer 1926, a touch signal line 1930 for the touch driving signal, a pixel electrode 1940 as the example of the first electrode, the first electrode protective layer 1950, a common electrode 1960 as the example of the second electrode, and the first connection pattern 1970 for connecting the pixel electrode 1940 with the data electrode 1920 are formed. Here, the common electrode 1960 as the second electrode and the first connection pattern 1970 are formed of the same material and in the same process. In addition, the second connection pattern 1990 may be selectively formed of the same material and by the same process as those of the touch signal line 1930.

The first touch connection pattern 1931 of the same material as the first electrode 1940 is formed under the touch signal line 1930, and the second connection pattern 1932 of the same material as the second electrode 1960 is formed on the touch signal line 1930.

Although the structure and manufacturing features suggested by the embodiment of the present invention may be applied to the VOT structure including the thin film transistor protective layer, such as the planarization layer or the overcoat layer, the present invention is not limited thereto, and it may be applied to the POT structure. That is, the mask reduction process of the present invention is compatible with the pixel-on-top (POT) structure as well as the Vcom-on-top (VOT) structure. In applying the present invention to the POT structure, the first electrode, of which the example is the pixel electrode in the VOT (or COT) structure, may be applied to the common electrode, and the second electrode, of which the example is the common electrode, may be applied to the pixel electrode. Further, the pixel electrode and the source/drain electrode may be connected with each other through a side contact during the formation of the common electrode. In the present embodiment, the thin film transistor protective layer may be replaced with other organic materials having low permittivity and may be applied with the planarization layer including the photosensitive material or the non-photosensitive material or the overcoat layer made of the organic material.

The mask-reduction process of the present invention may be applied to the structure including the touch signal line layer as well as lower substrates of a-Si, oxides and LTPS.

The embodiments of the present invention may be applied to the in-cell touch type, but the present invention is not limited thereto. In the first embodiment, the first connection pattern for connecting the first electrode with the source electrode or the drain electrode through the contact hole is formed of the same material and by the same process as those of the second electrode. Further, in the second embodiment, the first connection pattern for connecting the first electrode with the source electrode or the drain electrode through the contact hole and the second connection pattern are formed of the same material and by the same process as those of the second electrode and the touch signal line, respectively. In manufacturing the display device, reduced number of masks can be applied to every type of substrates for the connection patterns.

While the technical spirit of the present invention has been exemplarily described with reference to the accompanying drawings, it will be understood by a person skilled in the art that the present invention may be varied and modified in various forms without departing from the scope of the present invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

What is claimed is:

1. A method for fabricating signal lines of a display device integrated with a touch screen panel, the method comprising:
   forming a thin film transistor on a substrate;
   sequentially forming a thin film transistor protective layer covering the thin film transistor, a first electrode layer and a conductive metal layer;
   etching the first electrode layer, the conductive metal layer and the thin film transistor protective layer by using a first photo-mask to form a first contact hole, through which a source electrode or a drain electrode is exposed, in the first electrode layer and the thin film transistor protective layer, and forming a first electrode and a touch signal line;
   coating a first electrode protective layer;
   coating photoresist by using a second photo-mask and forming a first electrode and a first touch connection pattern separated from the first electrode; and
   forming a second electrode and a second touch connection pattern made of the same material as that of the second electrode to be connected with the second electrode by using a third photo-mask, and at the same time, forming a first connection pattern, which connects one of either the exposed source electrode or the drain electrode with the first electrode through the first contact hole.

2. The method of claim 1, wherein the forming the first electrode and the touch signal line further comprises forming a second connection pattern that is made of the same material as that of the touch signal line to overlap the first electrode.

3. The method of claim 1, wherein the forming the first connection pattern further comprises forming the first connection pattern on the second connection pattern to indirectly connect the first electrode with one of the exposed source electrode or the drain electrode.

4. The method of claim 1, wherein the forming the second touch connection pattern further comprises forming the second touch connection pattern on the touch signal line through a second contact hole which is formed in the first electrode protective layer.

5. The method of claim 4, wherein the width of the touch signal line is narrower than the first touch connection pattern, the first electrode protective layer is positioned at an edge of the width of the touch signal line, and the second contact hole is positioned in the first electrode protective layer to expose the touch signal line.

6. The method of claim 1, further comprising:
   forming a data pad connection portion with the same material as that of the second electrode to be positioned through a third contact hole in the first electrode protective layer; and
   forming a gate pad connection portion with the same material as that of the second electrode to be positioned through a fourth contact hole in the first electrode protective layer.

* * * * *